United States Patent [19]

Yasuhara et al.

[11] Patent Number: 4,531,193
[45] Date of Patent: Jul. 23, 1985

[54] MEASUREMENT APPARATUS

[75] Inventors: Takeshi Yasuhara; Eiichi Nabeta, both of Tokyo, Japan

[73] Assignee: Fuji Electric Company, Ltd., Kawasaki, Japan

[21] Appl. No.: 402,377

[22] Filed: Jul. 27, 1982

[30] Foreign Application Priority Data

| Jul. 30, 1981 | [JP] | Japan | 56-118412 |
| Jul. 30, 1981 | [JP] | Japan | 56-118413 |
| Jul. 30, 1981 | [JP] | Japan | 56-118414 |
| Jul. 30, 1981 | [JP] | Japan | 56-118415 |
| Jul. 30, 1981 | [JP] | Japan | 56-118416 |
| Jul. 30, 1981 | [JP] | Japan | 56-118417 |
| Aug. 3, 1981 | [JP] | Japan | 56-120723 |
| Aug. 3, 1981 | [JP] | Japan | 56-120724 |
| Aug. 15, 1981 | [JP] | Japan | 56-127336 |
| Aug. 26, 1981 | [JP] | Japan | 56-132750 |
| Aug. 28, 1981 | [JP] | Japan | 56-134224 |
| Aug. 28, 1981 | [JP] | Japan | 56-134225 |

[51] Int. Cl.³ .................................. G06F 15/20
[52] U.S. Cl. .................. 364/551; 364/484; 364/510; 377/21; 377/19
[58] Field of Search ............ 364/551, 550, 552, 555, 364/484, 492, 556, 557, 558, 510; 377/11, 19, 21

[56] References Cited

U.S. PATENT DOCUMENTS

| 3,655,956 | 4/1970 | Ley | 377/19 X |
| 3,739,276 | 6/1973 | Dornberger | 377/19 X |
| 3,921,152 | 11/1975 | Hagar et al. | 364/551 X |
| 3,936,740 | 2/1976 | Hogg et al. | 364/555 X |
| 4,120,032 | 10/1978 | Mirdadian | 377/21 X |
| 4,128,884 | 12/1978 | England | 364/555 X |
| 4,234,926 | 11/1980 | Wallace et al. | 364/551 |
| 4,258,422 | 3/1981 | Dougherty et al. | 364/509 X |
| 4,287,769 | 9/1981 | Buckley | 364/550 X |
| 4,290,538 | 9/1981 | White et al. | 377/21 X |
| 4,303,984 | 12/1981 | Houvig | 364/558 X |
| 4,387,434 | 6/1983 | Moncrief, Jr. et al. | 364/509 |
| 4,390,956 | 6/1983 | Cornforth et al. | 377/21 X |
| 4,404,638 | 9/1983 | Yada et al. | 377/21 X |
| 4,410,949 | 10/1983 | Huellinghorst et al. | 377/21 X |
| 4,420,809 | 12/1983 | Pierce | 364/484 |

Primary Examiner—Edward J. Wise
Attorney, Agent, or Firm—Brumbaugh, Graves, Donohue & Raymond

[57] ABSTRACT

Disclosed is a measurement apparatus for measuring physical quantity, such as temperature, pressure etc., and providing corresponding measuremnt data suitable for transmission to a remote central location. The physical quantity being measured is first converted to a frequency signal, either directly by an appropriate transducer or by a combination of an appropriate transducer and appropriate converter. Counters are then used to convert the frequency signal to a corresponding digital quantity. An appropriately programmed digital processor is then used to perform processing operations on the digital quantity to derive the measurement data. In one embodiment, the apparatus includes an optical transceiver for converting the measurement data into corresponding optical signals for transmission via an optical fiber to a central processor. The optical transmission system between the measurement apparatus and the central processor includes provisions for facilitating the detection and diagnosis of failures in the optical components of the system. In another embodiment the measurement data is converted to corresponding current signals for transmission via a conducter to a remote central location.

7 Claims, 26 Drawing Figures

MEASUREMENT APPARATUS

BACKGROUND OF THE INVENTION

The present invention relates to a measurement apparatus, and more particularly to measurement apparatus for converting a physical quantity into a digital quantity and for carrying out predetermined processing operations on the digital quantity to obtain measurement data suitable for transmission over an appropriate data path to a central location.

In the measurement of various physical quantities, such as the volume flow rate of a fluid, temperature, pressure, etc., transducers are frequently used to convert the physical quantity to a frequency, voltage, electrical resistance, or electrical capacitance. The output of the transceiver then undergoes further processing, either in its unaltered form or after an appropriate conversion, to produce measurement data.

One known type of transducer for converting a physical quantity into a frequency is a vortex-shedding flowmeter utilizing a von Kármán Vortex stream pattern. FIG. 1 is illustrates the princliples of operation of such flowmeter. The flowmeter is depicted in a schematic plan view showing a column-shaped vortex-shedding body OB placed in a fluid flow FL. Vortices BU are generated downstream of the body OB, alternately one on each side thereof, to produce an alternating pressure difference on the two sides of the body such that the pressure on the side where a vortex is formed is lower than that on the side where no vortex is formed. The alternating pressure difference is used to excite a vibratory plate (not shown) in a chamber (not shown) located either in the vortex-shedding body OB or outside thereof. The chamber is in communication with the fluid through openings or pressure transmission ports (not shown). The frequency F of generation of vorticles can be expressed as:

$$F = k \cdot V / D \tag{1}$$

where V is the speed of flow of the fluid, D is the diameter of the vortex-shedding body, and k is a constant. The speed of flow or the volume flow rate can be derived from the frequency F using equation (1). In a typical application the frequency signal provided by the flowmeter is converted into a corresponding voltage signal by a frequency-to-voltage (F/V) converter. The voltage signal is then converted into a corresponding current signal suitable for transmission along a conductor. In the prior art apparatus for carrying out such a measurement application use analog circuits for the processing of the measurement signals. However, such prior art measurement apparatus have the problem in that the analog circuits used therein are subject to thermal drift and sensitivity to noise which can reduce the accuracy of the measurement data provided by the apparatus.

Thermocouples or thermistors are widely used as transducers for converting a temperature into a corresponding voltage or resistance, respectively. Generally an operational amplifier is used to amplify the voltage generated by the thermocouple or the voltage drop accross the thermistor and to convert such voltage to a corresponding resistance at the output of the operational amplifier. In the prior art, the processing of the resistance signal to produce temperature measurement data is typically carried out in a measurement apparatus which uses analog circuitry. Consequently, such prior art measurement apparatus have the above described problems associated with the use of analog circuitry for processing of measurement signals. In addition, thermocouples and thermistors have nonlinear temperature vs. voltage and temperature vs. resistance characteristics, respectively. Therefore, it would be desirable for the measurement apparatus to have provisions for linearizing such nonlinear characteristics and for making other corrections and adjustments. Such provisions are difficult to implement with analog circuitry.

Transducers for converting a physical quantity into a corresponding capacitance are also well known. An example of such transducers is the capacitance manometer for measuring absolute or differential pressure. A typical capacitance manometer includes a flexible diaphragm which can be displaced by a differential pressure on the two sides thereof, a movable electrode attached to the diaphragm, and two fixed electrodes positioned one on each side of the diaphragm. The principles of operation of such a transducer will now be described with reference to FIGS. 2(A) and 2(B). In FIG. 2(A), a movable electrode $EL_V$ is disposed between two fixed electrodes both designated $EL_F$, the movable electrode $EL_V$ being attached to a flexible diaphragm (not shown) and laterally movable in the directions of the arrow R in response to a change in differential pressure on the two sides of the diaphragm. When the movable electrode $EL_V$ is thus displaced, one of the two capacitances $CA_1$ and $CA_2$ between the movable electrode and each of the fixed electrodes is increased while the other is decreased by a corresponding amount. Thus, the capacitances are differentially varied. Assuming that the area of each electrode is S, the dielectric constant between the electrodes is $\epsilon$ and the undisplaced distance between the movable electrode $EL_V$ and each of the fixed electrodes $EL_F$ is d, the capacitances $CA_1$ and $CA_2$ when the movable electrode $EL_V$ is displaced $\Delta d$ from its undisplaced position, as shown by the dotted line in FIG. 2(A), can be given as follows:

$$CA_1 = \epsilon A / (d - \Delta d), \text{ and} \tag{2}$$

$$CA_2 = \epsilon A / (d = \Delta d). \tag{3}$$

The sum and difference of the capacitances are given by the following equations:

$$CA_1 + CA_2 = \epsilon A \cdot 2d / (d^2 - (\Delta d)^2), \text{ and} \tag{4}$$

$$CA_1 + CA_2 = \epsilon A \cdot 2\Delta d / (d^2 - (\Delta d)^2). \tag{5}$$

The ratio between the sum and the difference may be expressed by:

$$(CA_1 - CA_2)/(CA_1 + CA_2) = \Delta d / d. \tag{6}$$

Thus, the displacement $\Delta d$ can be derived from the capacitance ratio $(CA_1 - CA_2)/(CA_1 + CA_2)$.

In FIG. 2(B) another pressure-to-capacitance transducer structure is shown in which the two fixed electrodes $EL_F$ are disposed adjacent to each other and the movable electrode $EL_V$ is positioned adjacent to one of the fixed electrodes $EL_F$. When the movable electrode $EL_V$ is displaced $\Delta d$ from its undisplaced position, as shown by the dotted line in FIG. 2(B), the capacitances $CA_1$ and $CA_2$ can be expressed as:

$$CA_1 = \epsilon A / d, \text{ and} \tag{7}$$

$$CA_2 = \epsilon A / (d - \Delta d). \tag{8}$$

The difference between the two capacitances is given by:

$$CA_1 - CA_2 = \epsilon A \cdot \Delta d / d(d + \Delta d). \quad (9)$$

The ratio of $CA_1 - CA_2$ to $CA_2$ is given by:

$$(CA_1 - CA_2)/CA_2 = \Delta d/d. \quad (10)$$

Thus, the displacement $\Delta d$ can be detected as a change in the capacitances.

In a typical application, a capacitance is measured by applying a high-frequency a-c voltage to the capacitance to be measured and deriving the value of the capacitance from the current flowing through the capacitance as a result of the a-c voltage. Prior art measurement apparatus for carrying out the processing of the current signal to derive the capacitance measurement data typically rely on analog circuitry for such processing. Therefore, such apparatus have the above-described problems associated with the use of analog circuitry. Furthermore, the capacitance measurement technique just described is also subject to errors caused by variations in the frequency and magnitude of the a-c voltage. Therefore, a need exists for a measurement apparatus which overcomes the above-described problems of the prior art and which provides measurement data suitable for transmission over an appropriate data path, such as an optical data link, whereby the measurement apparatus may be used in a high reliability measurement system having a plurality of remote measurement stations all coupled to a central processor.

SUMMARY OF THE INVENTION

The problems of the prior art discussed above are substantially solved by the present invention which is a measurement apparatus for measuring a physical quantity and providing corresponding measurement data. The physical quantity being measured is first converted to a frequency signal, either directly by an appropriate transducer or by a combination of an appropriate transducer and an appropriate converter. Counters are then used to convert the frequency signal to a corresponding digital quantity. An appropriately programmed digital processor is then used to perform processing operations on the digital quantity to derive the measurement data. In one embodiment of the invention, the measurement apparatus includes means for entering commands to the processor for performing processing operations to derive zero point and full scale correction data, memory means for storing the correction data for subsequent use in correcting measurement data and an optical transceiver coupled to an optical data link for transmitting the measurement data to a central processor on a time-share multiplexed basis with other measurement apparatus in a distributed measurement system. This embodiment further includes circuitry for putting measurement apparatus on a low power consumption standby mode when not requested to operate by the central processor, circuitry in the optical transceiver to permit the central processor to detect and diagnose failures in the transceiver and in the local transmission path, circuitry in the optical transceiver to prevent the transmitter therein from being stuck in the on condition, a double optical data link and a double transceiver at the control processor to permit the central processor to detect and diagnose failures of its transceiver components in its optical links and in the multiplexer.

DETAILED DESCRIPTION

Figure 1:
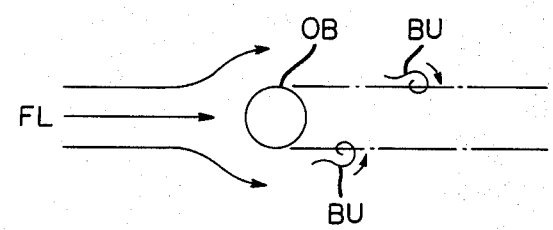
FIG. 1 is a schematic view of a known vortexshedding flowmeter for generating a pulse signal having a frequency dependent on the flow speed of a fluid.

The present invention will now be described in more detail with reference to the figures in the drawing in which like reference numerals or characters are used to denote like parts or components. According to an embodiment of the present invention, there is provided a measurement apparatus for converting a pulsed frequency signal derived directly from a physical quantity by a suitable transducer and having a frequency corresponding thereto into a digital quantity, and for carrying out predetermined processing operations on the digital quantity to obtain measurement data corresponding to the physical quantity. Such a measurement apparatus will now be described with reference to the block diagram of FIG. 3 and the circuit diagram of FIG. 4.

Figure 3:
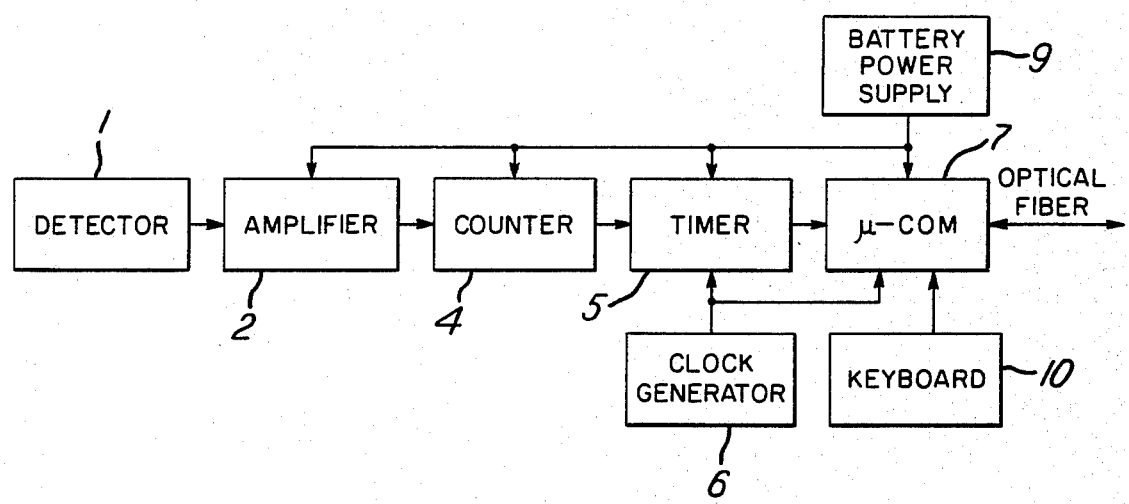
FIG. 3 is a block diagram of a measurement apparatus according to the present invention for use in conjunction with a transducer which provides a frequency signal whose frequency is related to a physical quantity being measured.
Figure 4:
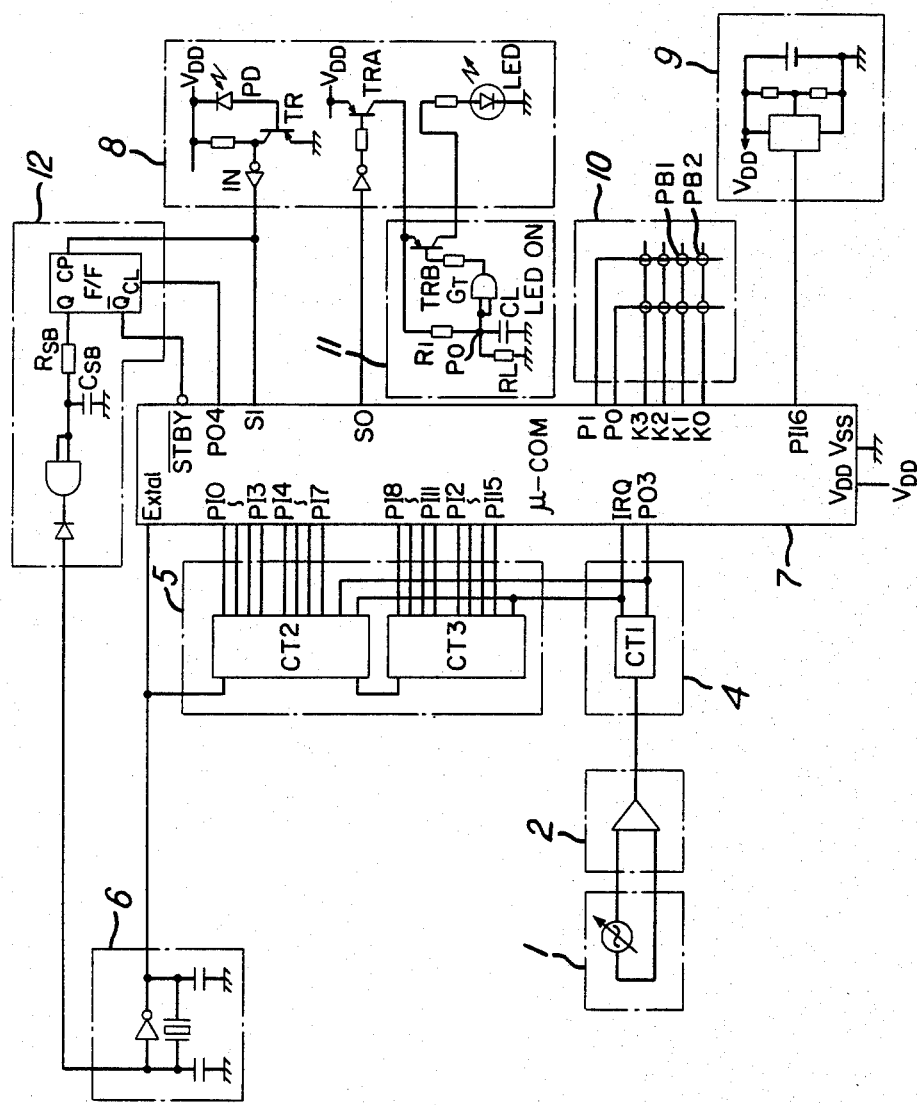
FIG. 4 is a schematic circuit diagram of some of the circuit blocks of the measurement apparatus shown in FIG. 3.

As shown in FIG. 3, the measurement apparatus comprises a detector 1 providing a frequency signal, an amplifier 2, a counter 4, a timer 5, a reference clock generator circuit 6, a stored program digital processor 7, such as a microprocessor of a type which is well known (hereinafter referred to as "μ-COM processor"), a battery power supply circuit 9, and a keyboard 10. The detector 1 may comprise, for example, von Kármán vortex stream pattern as illustrated in FIG. 1. Referring now to FIG. 4, the amplifier receives the frequency signal provided by the detector. The timer 5 comprises two counter stages CT2 and CT3 for counting the clock signal generated by the reference clock generator circuit 6. Counting by the timer begins when a reset signal PO3 from the μ-COM processor is released and stops when a count-up signal is received from the counter 4 (CT1). The μ-COM processor is powered by the battery power supply circuit 9 and receives the clock signal from the reference clock generator circuit 6 for the timing of the various processing operations and control operations. When no measurement is being performed, the μ-COM processor provides a reset signal PO3 for resetting the counter 4 and the timer 5. However, when a measurement is to be carried out, the μ-COM processor releases the reset signal PO3 to enable the counter 4 and the timer 5 to start their counting operations. The counter 4 counts the frequency signal provided by the detector and, after the count therein reaches a predetermined number, provides a counter-up signal to the IRQ terminal of the μ-COM processor. The μ-COM processor upon receiving the count-up signal, which serves as an interrupt signal, reads the count from the timer 5 through terminals PI0-PI15 and carries out predetermined processing operations on the count to obtain measurment data corresponding to the physical quantity. Connected to the μ-COM processor is a keyboard 10 for controlling the adjustment of the zero point, and full scale, an optical transceiver circuit 8 having a light-emitting element LED and a light-receiving element PD for optically transmitting information to or receiving information from a remote central processor, such as a general purpose computer (not shown), a standby mode circuit 12 for stopping the reference clock generator circuit 6 when the μ-COM processor goes to a standby mode to reduce power consumption, and a detector circuit 11 for preventing the light-emitting element LED in the optical transceiver circuit from being stuck on. The components will subsequently be described in more detail. The battery power supply circuit 9 provides the supply voltages to the various circuit blocks shown in FIG. 4.

Operation of the measurement apparatus will now be described. In response to the release of the reset signal PO3 by the μ-COM processor, the counter 4 and the timer 5 start operating. More specifically, the timer 5 starts counting the clock pulses provided by the reference clock generator circuit 6. The counter 4 starts counting a frequency signal from the detector 1 amplified by the amplifier 2. When the counter 4 reaches a predetermined number n, it provides a count-up signal to the timer 5 to stop counting and, at the same time, provides the count-up signal to the μ-COM processor as an interrupt signal IRQ to signal the μ-COM processor that the counter has completed its counting operation. In response to the interrupt signal IRQ, the μ-COM processor reads the count from the timer through the terminals PI0–PI15 and carries out predetermined processing operations on the count for deriving measurement data corresponding to the physical quantity. The number of cycles n of the frequency signal counted by the counter before a counter-up signal issues to stop the timer should be large enough to allow a significantly large count to build up in the timer. Therefore, the selection of the number n depends on the frequency of the reference clock generator in comparison to the frequency of the frequency signal. The frequency F of the frequency signal can thus be determined from the number of clock pulses counted by the timer when the counter reaches the number n and by computing the time T represented by the count in the timer. The frequency F is given the following equation:

$$F = n/T \tag{11}$$

With the foregoing arrangement, a physical quantity which has been converted into a frequency signal is again converted by the timer and the counter into a digital quantity, and predetermined arithmetic operations are performed on the digital quantity to obtain measurement data corresponding to the physical quantity. Such an arrangement is capable of a much higher measuring accuracy than conventional measurement apparatus using analog circuits.

Figure 5:
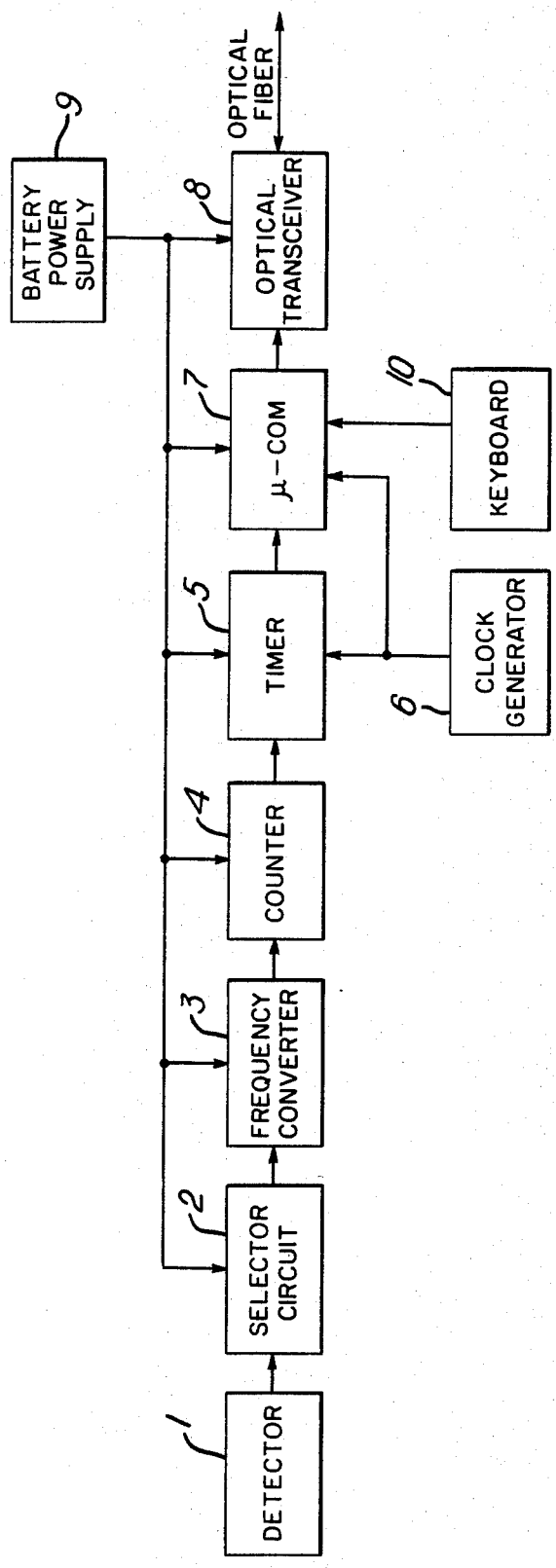
FIG. 5 is a block diagram of a measurement apparatus according to the present invention for use in conjunction with a transducer which provides a voltage which is related to a physical quantity being measured.
Figure 6:
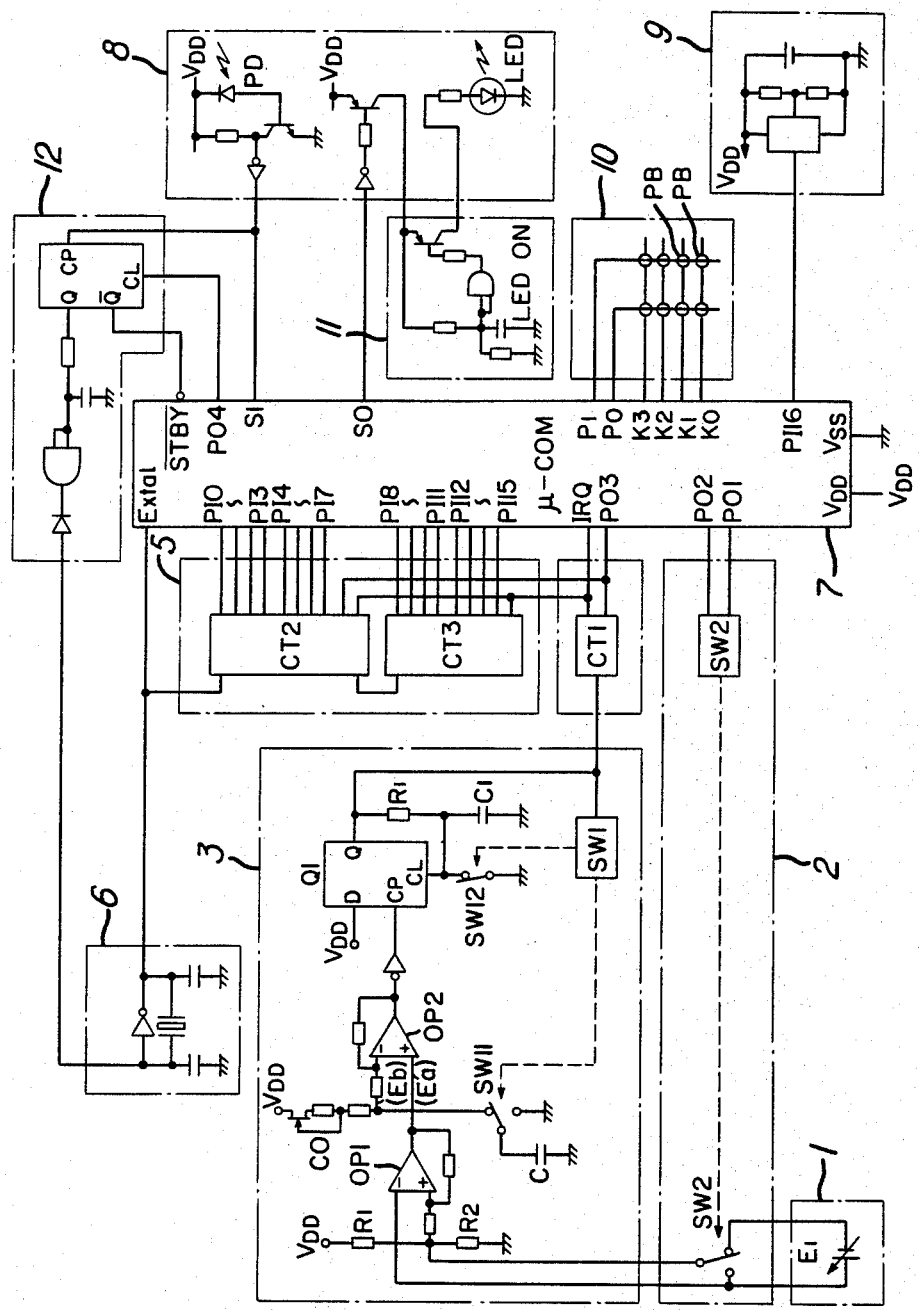
FIG. 6 is a schematic circuit diagram of some of the circuit blocks of the measurement apparatus shown in FIG. 5.

A measurement apparatus according to another embodiment will now be described with reference to the block diagram of FIG. 5, the circuit diagram of FIG. 6, and the waveform diagram of FIG. 7. The measurement apparatus finds use in applications in which a physical quantity is first detected by an appropriate transducer as a voltage signal having a magnitude corresponding to the physical quantity. As shown in FIG. 5, the measurement apparatus includes a detector 1 providing a voltage signal $E_1$, a selector circuit 2, a frequency converter circuit 3, a counter 4, a timer 5, a reference clock generator circuit 6, a stored program digital processor 7, such as a microprocessor of a type which is well known (hereinafter referred to as "μ-COM processing circuit"), an optical transceiver circuit 8, a battery power supply circuit 9, and a keyboard 10. The circuit diagram of FIG. 6 shows only the detector 1, the selector circuit 2, and the frequency converter circuit 3, with the other blocks being the same as corresponding blocks shown in FIG. 4, being omitted. Referring now to FIG. 6, the detector 1 is a voltage source such as a thermocouple, and the selector circuit 2 comprises a switch SW2, such as a complementary MOS (CMOS) analog switch or a relay, for switching the voltage $E_1$ provided by the detector. The frequency converter circuit 3 comprises a capacitor C, a constant current source CO, an operational amplifier OP2 for comparing a voltage Eb across the capacitor C and a voltage Ea as provided by an operational amplifier OP1 and for providing an output signal when the voltage Eb is equal to or greater than the voltage Ea, a D-type flip-flop Q1 operated as a monostable flip-flop which can be set by the output signal from the operational amplifier OP2 and is self-cleared after an interval of time determined by the product of a resistance Rf and a capacitance Cf, and a switch SW1 controlling switching elements SW11 and SW12. A special circuit such as a Schmitt trigger may be required in front of the flip-flop Q1 for setting the threshold lever thereof. However, such a circuit is not needed where a CMOS flip-flop is used, since the threshold voltage of a CMOS flip-flop may be set internally. The switch SW1 is of the same construction as that of the switch SW2. The $\mu$-COM processor provides mode selection signals PO1 and PO2 to the switch SW2 in the selector circuit 2 for selecting between a "zero measurement mode" in which zero voltage is applied to the frequency converter circuit and an "$E_1$ measurement mode" in which the voltage across the detector is applied to the frequency converter circuit.

Operation of the measurement apparatus will now be described with reference to FIGS. 6 and 7. Initially, no mode selection signals PO1 and PO2 are provided by the $\mu$-COM processor and the counter 4 and the timer 5 are reset by a reset signal PO3. When a zero measurement mode signal, as shown in waveform (a) in FIG. 7, is supplied to release the reset signal, as shown by waveform (b) in FIG. 7, the capacitor C is charged, as indicated by Eb in waveform (c), by a constant current flowing from circuit CO. In the zero measurement mode, the switch SW2 disconnects the detector 1 from the frequency converter circuit. A voltage divider comprising resistors R1 and R2 provides a differential voltage of $K_2VDD$ ($K_2=R_2/(R_1+R_2)$) to the inputs of the operational amplifier OP1 which in turn provides an output voltage of $K_1K_2VDD$ ($K_1$ being the gain of the operational amplifier OP1) to one input of the operational amplifier OP2. The operational amplifier OP2 compares the output voltage of the operational amplifier OP1 with the voltage across the capacitor C, denoted as Ea and Eb, respectively, and if Eb is greater than Ea, OP2 provides an output signal to set the flip-flop Q1. The relationship between the voltages Ea and Eb is shown by waveform (c) in FIG. 7. The output of flip-flop Q1 is coupled to the counter 4 (CT1) and the switch SW1. When Q1 is set, the switch element SW12 is opened to permit charging of capacitor Cf through resistor Rf, and the switch element SW11 disconnects the capacitor C from the operational amplifier OP2 and causes C to discharge. When the voltage across the capacitor Cf reaches a predetermined level after a time interval $t_c$, as illustrated by waveform (e) in FIG. 7, the flip-flop Q1 is cleared. Consequently, the flip-flop Q provides an output pulse having a width of $t_c$, as shown by waveform (d) in FIG. 7. When the flip-flop Q1 is cleared, SW11 connects C to OP2 and CO, and SW12 connects Cf to ground. Under these conditions, C is allowed to charge, while Cf is prevented from charging. Since the time $t_1$ (denoted in waveform (d) in FIG. 7) required for the voltage across C to reach the voltage at the output of OP1 is related to the differential input voltage of OP1, the frequency of the pulse sequence provided by flip-flop Q1 is related to the differential input voltage of OP1. The pulse sequence provided by Q1 is counted by the counter 4. When the count in the counter reaches a predetermined value, the counter produces a count-up signal, as shown by waveform (f) in FIG. 7, to stop counting operation in the timer 5, as illustrated by waveform (g) in FIG. 7. The timer had been counting clock pulses from the pulse generator circuit from the time of the release of the reset signal PO3. Upon stoppage of the counting, the count in the timer 5 is read by the $\mu$-COM processor which also receives the count-up signal.

The voltages Ea and Eb received by the inputs of the operational amplifier OP2 can be expressed by the following equations:

$$Ea = K_1K_2VDD, \text{ and} \quad (12)$$

$$Eb = \frac{1}{C}\int Idt = \frac{I}{C}t. \quad (13)$$

where I is the constant current supplied to the capacitor C by CO, and K1, K2 are constants as described above. If the time at which Eb reaches Ea is $t_1$, then from equations (12) and (13) one obtains:

$$\frac{I}{C} \cdot t_1 = K_1K_2VDD. \quad (14)$$

Hence the time $t_1$ can be determined by the equation:

$$t_1 = \frac{C}{I} K_1K_2VDD. \quad (15)$$

Figure 7:
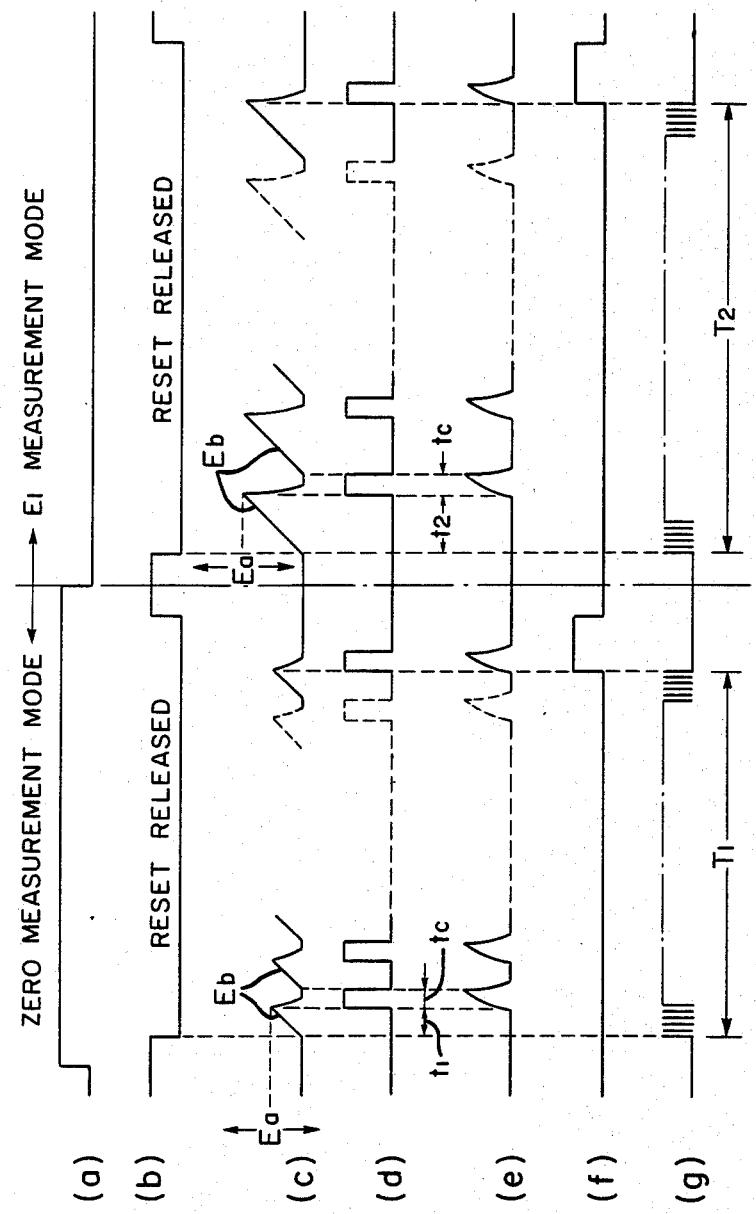
FIG. 7 is a waveform diagram illustrative of measuring operations of the measurement apparatus of FIG. 6.

If the capacitor C is caused to discharge after a time $t_c$, determined by the capacitor Cf and the resistor Rf, the period of the pulse sequence from Q1 is $t_1+t_c$, as shown in waveforms (c) and (d) in FIG. 7. If the counter is allowed to count n pulses from Q1 before issuing the counterup signal, the total time $T_1$ required to count n pulses may be expressed as:

$$T_1 = nt_1 + (n-1)t_c. \quad (16)$$

In short, during $T_1$, capacitor C charges n times and discharges $n-1$ times. Counting the capacitor chargings for n times results in increased accuracy of the time measurement as made by the timer. As discussed above, the choice of the number n depends on the frequency of the reference clock generator circuit and the value of the capacitor C.

After the zero measurement mode total counting time $T_1$ has been determined, the $\mu$-COM processor provides the mode selection signals PO1 and PO2 for the $E_1$ measurement mode, and switch element SW2 connects the voltage being measured $E_1$ to the operational amplifier OP1. The $E_1$ measurement mode total counting time $T_2$ is then determined in the same manner described above for the zero measurement mode total counting time $T_1$. Since the voltage being measured $E_1$ is applied to the input terminal $E_a$ of the operational amplifier OP2, a charging time $t_2$ for the capacitor C is given as:

$$t_2 = \frac{C}{I} K1(K2VDD + E_1). \qquad (17)$$

The $E_1$ measurement mode total counting time $T_2$ may be expressed by:

$$T_2 = nt_2 + (n-1)t_c. \qquad (18)$$

The difference between the times $T_2$ and $T_1$ as expressed by the equations (18), (16) is given by:

$$T_2 - T_1 = n\frac{C}{I} K1E_1 = KE_1. \qquad (19)$$

Thus, the voltage being measured $E_1$ can be derived from the difference between the total counting times $T_2$ and $T_1$ in the $E_1$ measurement mode and the zero measurement mode, respectively. The $\mu$-COM processor carries out processing operation for computing the total counting times $T_1$ and $T_2$ from the count data of the timer and for converting the difference $(T_2-T_1)$ in the total counting times to measurement data corresponding to the voltage $E_1$ according to equation (19). The programming of a microprocessor to compute the total counting times $T_1$ and $T_2$ from respective count data of the timer, for computing the difference between the counting times and for solving equation (19) for the value of the voltage being measured $E_1$ will be obvious to one skilled in the art and therefore need not be further described.

With the foregoing arrangement, a change in a physical quantity is first converted into voltage change for measurement and the voltage change is then converted into a frequency signal. Subsequently, the frequency signal is converted into a corresponding digital signal on which predetermined processor operations are performed to obtain measurement data. The measurement apparatus is therefore advantageous in that it can measure physical quantities with increased accuracy, and can easily perform a variety of compensational processing operations such as for zero point and full scale adjustment, temperature compensation and the like simply by changing the programs in the $\mu$-COM processor.

Figure 8:
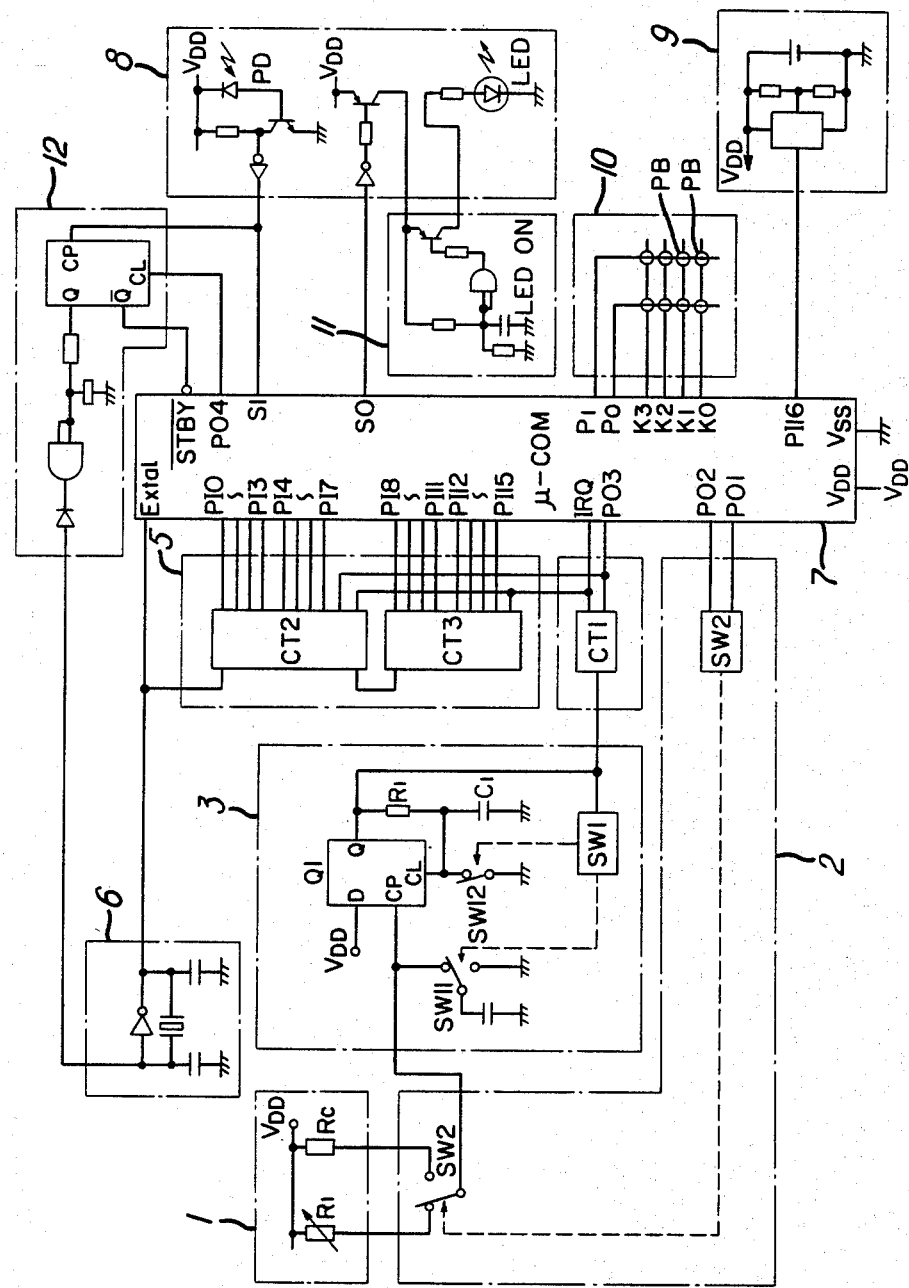
FIG. 8 is a schematic circuit diagram of some of the circuit blocks of a measurement apparatus according to the present invention for use in conjunction with a transducer which provides a resistance which is related to a physical quantity being measured, the block diagram of the apparatus being substantially the same as that shown in FIG. 5.
Figure 9:
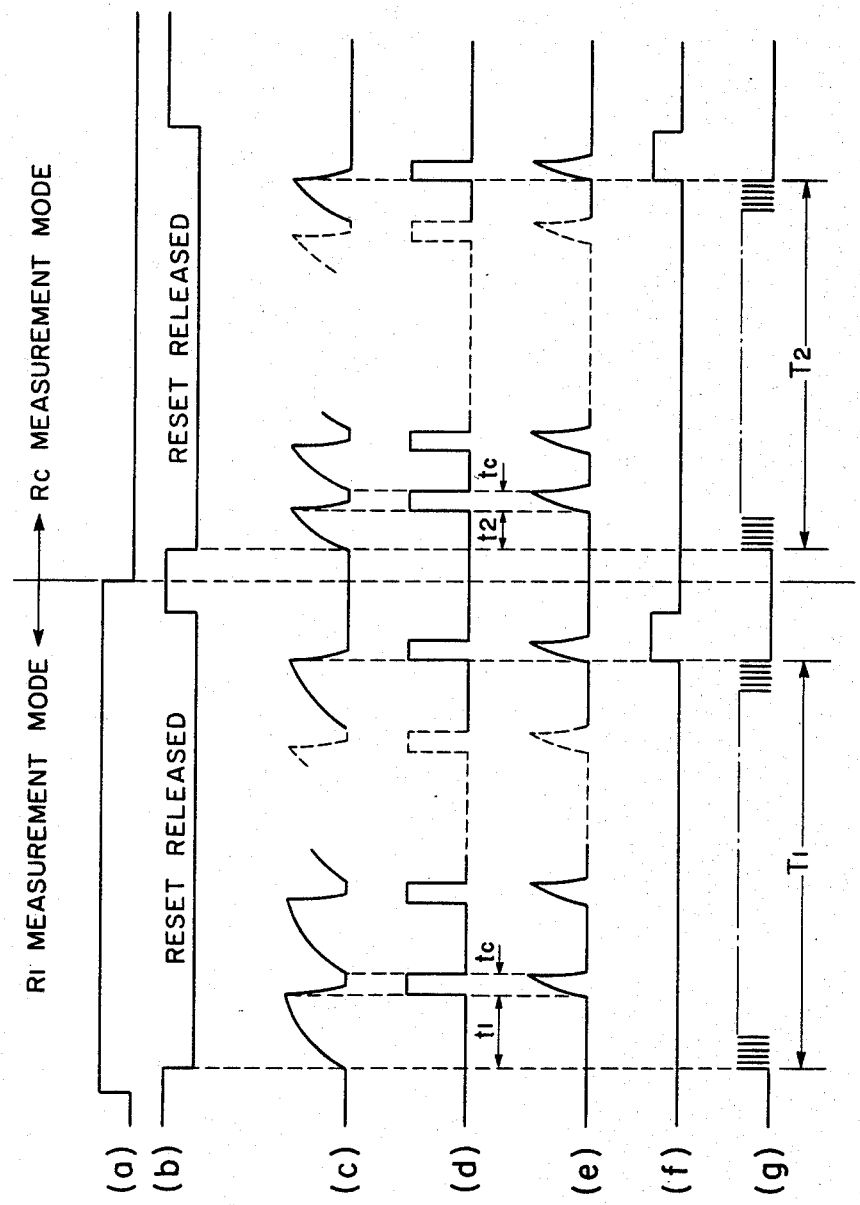
FIG. 9 is a waveform diagram illustrative of measuring operations of the measurement apparatus of FIG. 8.

The measurement apparatus according to still another embodiment of the invention is suitable for use in applications in which a physical quantity is first converted to a corresponding resistance. The resistance measurement apparatus has the same block diagram as that of FIG. 5 except that the voltage detector is replaced by a resistance detector. A circuit diagram of blocks 1, 2 and 3 are shown in FIG. 8, and a diagram showing the waveforms of FIG. 8 is depicted in FIG. 9. A modified measurement apparatus will then be described with reference to FIGS. 10 and 11.

As shown in FIG. 8, a detector 1 comprises a resistance to be measured $R_1$ and a standard resistance $R_c$, a selector circuit 2 comprising a switch SW2 (such as a relay or CMOS analog switch) for selecting either $R_1$ or $R_c$. One end of each of $R_1$ and $R_c$ is connected to a VDD supply. A frequency converter circuit 3 is selectively connected via SW2 to the other end of $R_1$ or $R_c$ and includes a switch SW1 having switch elements SW11 and SW22 for selectively charging or discharging a capacitor C with a current dependent on the resistance of $R_1$ or $R_c$ and for clearing a D-type flip-flop Q1. The flip-flop Q1, which is connected as a monostable flip-flop, is set when the voltage across the capacitor C exceeds a predetermined voltage level (threshold level) and is automatically cleared after a certain period of time determined by the values of a resistance Rf and a capacitance Cf. The $\mu$-COM processor 7 delivers mode selection signals PO1 and PO2 to the switch SW2 in the selector circuit 2 to select either a $R_1$ measurement mode ($R_1$ mode) or a $R_c$ measurement mode ($R_c$ mode).

The measurement apparatus operates in the following manner with reference to FIGS. 8 and 9. Initially, no mode selection signals PO1 and PO2 are given by the $\mu$-COM processor, and the counter 4(CT1) and the timer 5 remain reset by the reset signal PO3. When a $R_1$ measurement mode signal, as shown by waveform (a) in FIG. 9, is issued by the $\mu$-COM processor, the reset signal PO3 is released, as shown by waveform (b) in FIG. 9, and SW2 and SW11 provide a path from the power supply VDD through $R_1$ and C to ground for the charging of C, as illustrated by waveform (c) in FIG. 9. When the voltage across C exceeds the threshold voltage VTH for the flip-flop Q1 after a period of time $t_1$, Q1 is set and a high level signal is provided at its output terminal Q. The output from the flip-flop Q1 is fed to the counter 4 and the switch SW1. Under these conditions, SW12 is opened to permit the charging of Cf through Rf, and SW11 is switched to discharge the capacitor C. When the voltage across Cf reaches a predetermined level after a time $t_c$, as shown by waveform (e) in FIG. 9, the flip-flop Q1 is cleared. Thus, the output pulse of Q1 has a width of $t_c$, as illustrated by waveform (d) in FIG. 9. Upon clearing of the flip-flop Q1, SW12 switches to hold Cf in a discharged state. Since the charging time $t_1$ is related to the capacitance C and the resistance of $R_1$, the pulse sequence provided by Q1, as shown by waveform (d) in FIG. 9, has a frequency which is related to the value of $R_1$. The pulse sequence from the flip-flop Q1 is counted by the counter 4. When the count in the counter reaches a predetermined value, the counter produces a count-up signal, as shown by waveform (f) in FIG. 9, to stop the counting in the timer 5, as shown by waveform (g) in FIG. 9. The timer had commenced counting of the clock pulses from the pulse generator circuit 6 at the release of the reset signal PO3. The count in the timer is read by the $\mu$-COM processor which also received the count-up signal from the counter.

The threshold voltage VTH for the flip-flop Q1 is given as follows:

$$VTH = VDD\left(1 - \exp\frac{T_1}{R_1 C}\right). \qquad (20)$$

The charging time $t_1$ (as shown by waveform (d) in FIG. 9) for the capacitor C may be expressed as:

$$t_1 = -R_1 C \log_e\left(1 - \frac{VTH}{VDD}\right), \qquad (21)$$

where VDD is the power supply voltage. The discharging time $t_c$ may be expressed by the following equation:

$$t_c = -R_f C_f \log_e\left(1 - \frac{V_{TH}}{V_{DD}}\right). \tag{22}$$

With the resistance of the resistor Rf and the capacitance of the capacitor Cf being known, the time $t_c$ is a constant.

Accordingly, by counting clock pulses supplied by the reference clock generator circuit during the time required for the counter to count n pulses from Q1, the total counting time $T_1$ can be computed from the count in the timer. As can be seen from waveform (d) of FIG. 9, during the interval $T_1$, the capacitor is charged n times and discharged n−1 times. Therefore, the $R_1$ mode total counting time $T_1$ may be expressed as:

$$T_1 = nt_1 + (n-1)t_c. \tag{23}$$

By allowing the timer to count clock pulses over the period of n pulses from Q1, the accuracy of the time measurement derived from the count in the timer is increased. The selection of the number n depends on the frequency of the clock pulses, the resistance of R and the capacitance of C. In the illustrated embodiment, n is selected to be 256.

After the $R_1$ mode total counting time $T_1$ has been determined, the μ-COM processor provides mode signals PO1 and PO2 to cause SW2 to switch to its $R_c$ measurement mode configuration. In this mode SW2 and SW12 provide a path from VDD through $R_c$ and C to ground for the charging of C, as illustrated by waveform (d) in FIG. 7. The $R_1$ mode total counting time $T_2$ is then determined in the same manner as described above for the determination of the $R_1$ mode total counting time $T_1$. A charging time $t_2$ for the capacitor C can be expressed by the following equation:

$$t_2 = -R_c C \log_e\left(1 - \frac{V_{TH}}{V_{DD}}\right). \tag{24}$$

As before, the discharging time $T_c$ is given by equation 22. The $R_c$ mode total counting time $T_2$ is given by:

$$T_2 = nt_2 + (n-1)t_c. \tag{25}$$

By substituting equations (21) and (22) in equation (23) and equations (24) and (22) in equation (25) one obtains:

$$T_1 - (n-1)t_c = -nCR_1 \log_e\left(1 - \frac{V_{TH}}{V_{DD}}\right), \text{ and} \tag{26}$$

$$T_2 - (n-1)t_c = -nCR_c \log_e\left(1 - \frac{V_{TH}}{V_{DD}}\right). \tag{27}$$

By dividing equation (26) by equation (27), the following is obtained:

$$\frac{T_1 - (n-1)t_c}{T_2 - (n-1)t_c} = \frac{R_1}{R_c} \tag{28}$$

Therefore, the μ-COM processor is used to perform processing operations based on equation (28) to determine the value of the unknown resistance $R_1$. The programming of a processor to compute $T_1$ and $T_2$ from the respective counts in the timer and to solve equation (28) to obtain measurement data corresponding to the value of $R_1$ will be obvious to one skilled in the art and therefore need not be further described.

It will be noted that because equation (28) is derived by dividing equations (26) and (27), variations in the values of C, VDD and VTH tend to divide out.

Where CMOS analog switches are used for the switch elements of SW1 and SW2, the relatively high ON resistance of such switches may introduce errors in the resistance measurements. Therefore, relays are advantageously used as the switch elements of the foregoing apparatus.

Figure 10:
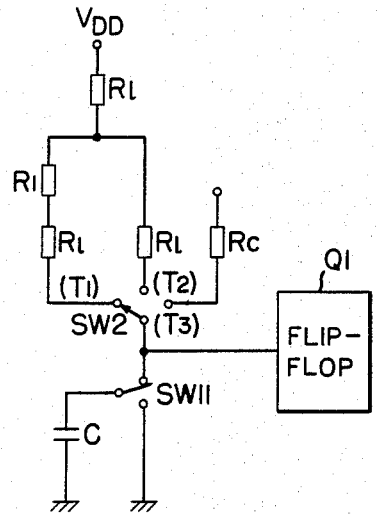
FIG. 10 is a schematic circuit diagram of an alternative configuration of a circuit illustrated in FIG. 8.

The foregoing arrangement is applicable to uses in which the parasitic line resistance in series with $R_1$ is negligible. Where the line resistance Rl is not negligible, the following arrangement should be employed. FIG. 10 shows a modified circuit for the detector to be used in applications in which the line resistance has an non-negligible adverse effect on operation of the measurement apparatus. The arrangement of FIG. 10 differs from that shown in FIG. 8 in that there is included provisions for measuring the line resistance Rl. The capacitor C, the switch SW11, and the flip-flop Q1 are the same as that shown in FIG. 8.

In FIG. 10, a switch SW2 is successively switched to respective positions for determining the total counting time corresponding to input resistances of $R_1 + 2Rl$, $2Rl$, and $R_c$. Assuming that the charging times of the capacitor C for the resistances $R_1 + 2Rl$, $2Rl$, and $R_c$ are $t_1$, $t_2$ and $t_3$, respectively, and the total counting times for the above resistances are $T_1$, $T_2$ and $T_3$, respectively, these times may be expressed as follows:

$$t_1 = -C(R_1 + 2Rl) \log_e\left(1 - \frac{V_{TH}}{V_{DD}}\right), \tag{29}$$

$$t_2 = -2CRl \log_e\left(1 - \frac{V_{TH}}{V_{DD}}\right), \tag{30}$$

$$t_3 = -CR_c \log_e\left(1 - \frac{V_{TH}}{V_{DD}}\right), \tag{31}$$

$$T_1 = nt_1 + (n-1)t_c, \tag{32}$$

$$T_2 = nt_2 + (n-1)t_c, \text{ and} \tag{33}$$

$$T_3 = nt_3 + (n-1)t_c. \tag{34}$$

From the above equations the following equation may be derived:

$$\frac{T_1 - T_2}{T_3 - (n-1)t_c} = \frac{R_1}{R_c}. \tag{35}$$

The μ-COM processor performs processing operations based on equation (35) to determine the value of $R_1$. The programming of a processor to solve equation (35) will be obvious to one skilled in the art.

Figure 11A:
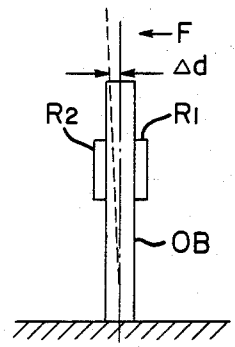
FIGS. 11A and 11B are a schematic circuit diagram of an alternative configuration of a circuit illustrated in FIG. 8 suitable for use in conjunction with a wire strain gauge.
Figure 11B:
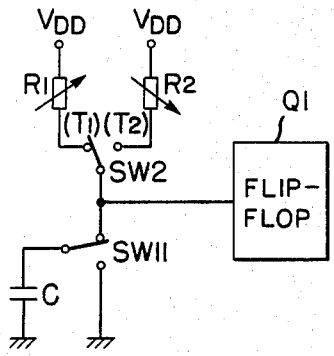

An application in which a pressure or strain is measured utilizing a change in resistance will now be described. FIG. 11A shows a pair of wire strain gages $R_1$ and $R_2$ attached to two sides of an object OB for measuring a force F or a displacement Δd imposed on the object OB by a force F. When the object OB is displaced d under a force F applied thereto, the resistances of the wire strain gages $R_1$ and $R_2$ changes by $+\Delta R$ and $-\Delta R$, respectively, $\Delta R$ being substantially proportional to the force F or the displacement $\Delta d$. FIG. 11B illustrates a circuit arrangement for measuring the resistances $R_1$ and $R_2$. The operation of the arrangement of FIG. 11B is the same as that of the arrangement shown in FIG. 8. More specifically, the switch SW2 is used to select either $R_1$ or $R_2$ for determining the charging times $t_1$ and $t_2$ and the total counting times $T_1$ and $T_2$ for the resistors $R_1$ and $R_2$, respectively. The following equation may be derived from which the differential change of $R_1$ and $R_2$ may be determined:

$$\frac{T_1 - T_2}{T_1 + T_2 - 2(n-1)t_c} = \frac{R_1 - R_2}{R_1 + R_2} . \tag{36}$$

Since $R_1 = R + \Delta R$, and $R_2 = R - \Delta R$, the righthand side of the equation (36) becomes $\Delta R/R$, and the force applied or the strain resulting therefrom may be derived from $\Delta R$. Programming of a processor to solve equation (36) and to convert the differential resistance change to an equivalent force or displacement will be obvious to one skilled in the art.

With the foregoing arrangement of the present invention, a change in a physical quantity (force or displacement) is converted into a change in resistance which is then converted into a correspoinding frequency signal. The frequency signal is in turn converted into a digital quantity on which predetermined processing operations are performed to obtain measurement data corresponding to the physical quantity. The measurement apparatus can measure physical quantities with increase accuracy, and can perform various compensational processing operations such as zero point and full scale adjustments and temperature compensation simply by changing the programs in the $\mu$-COM processor.

While in the above-described embodiments the physical quantity is determined by measuring the charging time for the standard capacitor C, the physical quantity can likewise be determined by measuring the discharging time for the capacitor C with appropriate modifications as will be obvious to one skilled in the art. Although the capacitor C and the flip-flop Q1 have been described as being shared by both the $R_1$ and $R_c$ measurement modes, separate capacitors and flip-flops may be provided for the $R_1$ and $R_c$ measurement modes.

Figure 12:
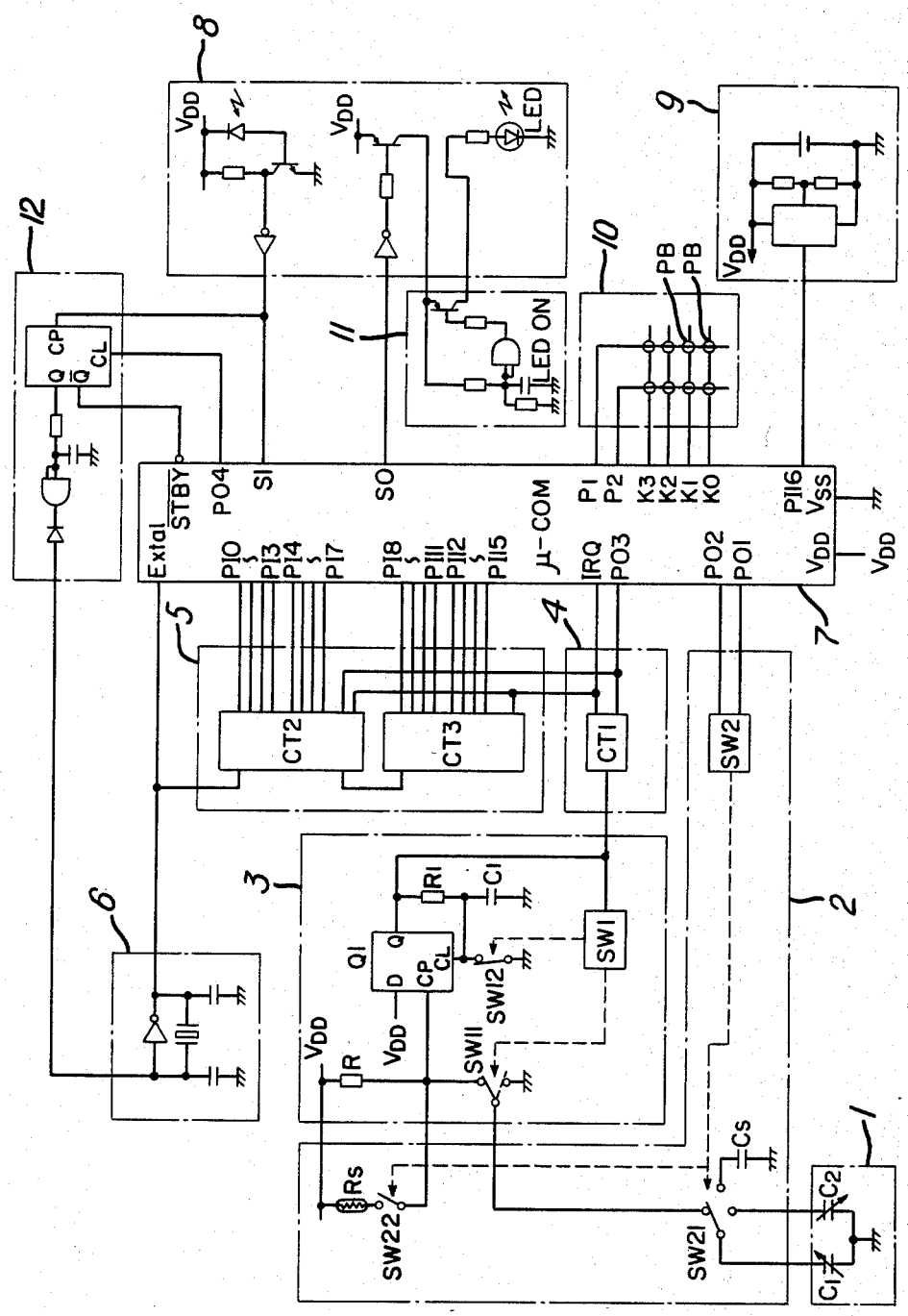
FIG. 12 is a schematic circuit diagram of some of the circuit blocks of a measurement apparatus according to the invention for use in conjunction with a transducer which provides a capacitance which is related to a physical quantity being measured.

According to still another embodiment, the measurement apparatus senses a capacitance which corresponds to a physicial quantity being measured. The measurement apparatus will now be described with reference to the block diagram of FIG. 5 in which the voltage detector 1 of FIG. 4 is replaced with a capacitance detector 1, the circuit diagram of FIG. 12 depicting circuit blocks 1, 2 and 3 of FIG. 5 and the waveform diagrams of FIG. 9, which is shared for the circuits shown in FIGS. 8 and 12. A modification of the measurement apparatus will also be described with reference to FIG. 13. As shown in FIG. 12, the detector 1 comprises capacitors $C_1$ and $C_2$ and the selector circuit 2 comprises a CMOS analog switch SW2 having switch elements SW21 and SW22. Switch element SW21 is used for selecting $C_1$, $C_2$ or a temperature measuring capacitor CS as the input capacitor for the frequency converter circuit 3, while switching element SW22 selectively connects a thermistor $R_s$ as the charging resistor for the converter circuit. A capacitance-to-frequency converter circuit 3 comprises an analog switch SW1 having switch elements SW11 and SW12, and a D-type flip-flop Q1 operated as a monostable flip-flop with a resistor Rf and a capacitor Cf. Switch element SW11 serves to selectively charge or discharge the input capacitor, while switch element SW12 serves to selectively discharge capacitor Cf. The flip-flop Q1 is set when the voltage across the input capacitor exceeds a predetermined voltage level (threshold level) and is automatically cleared after a certain interval of time which is determined by the values of Rf and Cf. The $\mu$-COM processor 7 supplies mode selection signals PO1 and PO2 to the analog switch SW2 in the selector circuit 2 for selecting a capacitance $C_1$ measurement mode, a capacitance $C_2$ measurement mode, or a temperature measurement mode (using the thermistor Rs and the capacitor Cs).

The circuits shown in FIGS. 8 and 12 differ from each other primarily in that the circuit of FIG. 8 makes use of a proportional relationship between an input resistance and the physical quantity to be measured, whereas the circuit of FIG. 12 makes use of a proportional relationship between an input capacitance and the physical quantity to be measured. Therefore, the operation of the circuit of FIG. 12 can be understood with reference to the foregoing description of the operation of the circuit of FIG. 8.

After the total counting time $T_1$ for the capacitor $C_1$ has been determined, the $\mu$-COM processor provides mode selection signals PO1 and PO2 to switch SW21 to the $C_2$ measurement mode configuration for measuring the total counting time $T_2$ for the capacitor $C_2$. As before, the total counting times $T_1$ and $T_2$ can be respectively expressed as:

$$T_1 = nt_1 + (n-1)t_c, \text{ and} \tag{37}$$

$$T_2 = nt_2 + (n-1)t_c. \tag{38}$$

Adding equations (37) and (38) and substituting for $t_1$ and $t_2$, one obtains:

$$T_1 + T_2 - 2(n-1)t_c = -R(C_1 + C_2)\log_e\left(1 - \frac{VTH}{VDD}\right). \tag{39}$$

Subtracting equations (37) and (39) and substituting for $t_1$ and $t_2$, one obtains:

$$T_1 - T_2 = -R(C_1 - C_2)\log_e\left(1 - \frac{VTH}{VDD}\right). \tag{40}$$

Dividing equation (40) by equation (39), one obtains:

$$\frac{T_1 - T_2}{T_1 + T_2 - 2(n+1)t_c} = \frac{C_1 - C_2}{C_1 + C_2} . \tag{41}$$

Figures 2A, 2B:
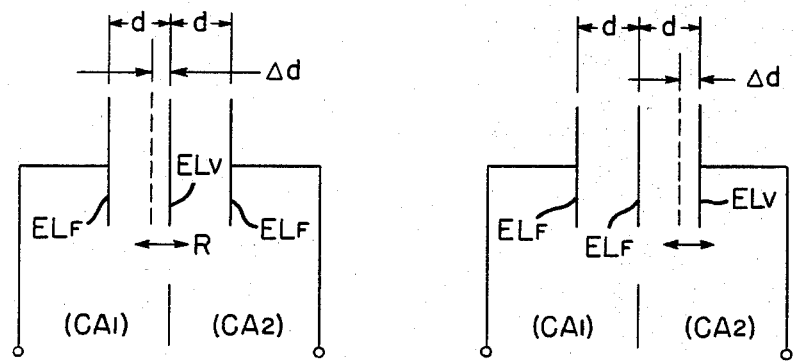
FIGS. 2(A) and 2(B) are schematic views of known detectors for producing a capacitance signal dependent on a mechanical displacement.

As can be understood from the description with reference to FIG. 2(A), the quantity on the right side of equation (41) is proportional to the displacement of an electrode. Therefore, the $\mu$-COM processor can determine the displacement by performing processing operations for solving equation (41). The programming of a processor to solve equation (41) will be obvious to one skilled in the art and, therefore, need not be further described.

Figure 13:
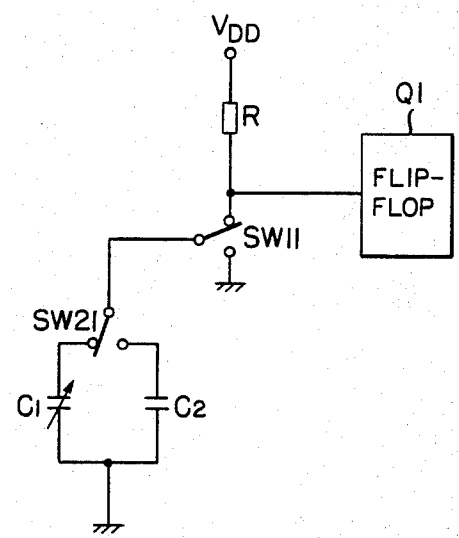
FIG. 13 is a schematic circuit diagram of an alternative configuration of a circuit block illustrated in FIG. 12.

In the above circuit arrangement, the capacitances of the capacitors $C_1$ and $C_2$ are differentially varied to measure a physical displacement such as a differential pressure ΔP. However, the principles of the illustrated measurement apparatus can be applied to an arrangement in which one of the capacitors $C_2$ is fixed and the other capacitor $C_1$ is variable, as illustrated in FIG. 13. Such a modification can readily be understood with reference to the transducer of FIG. 2(B). With such a modified arrangement, a pressure P would be determined, instead of the differential pressure ΔP, according to the following equation:

$$P = \frac{C_1 - C_2}{C_2} = \frac{T_1 - T_2}{T_2 - (n-1)t_c} . \quad (42)$$

If there exists a stray capacitance $C_{ST}$ connected in parallel to each of the capacitors $C_1$ and $C_2$, then $C_1$ becomes $C_1 + C_{ST}$ and $C_2$ becomes $C_2 + C_{ST}$. The quantity $C_1 - C_2$ is not altered by the stray capacitance $C_{ST}$. However, $2C_{ST}$ is added to $C_1 + C_2$. To compensate for the effects of the stray capacitance, an arithmetic operation of $(C_1 - C_2)/(C_1 + C_2 - 2C_{ST})$ should be performed, that is, the following expression should be used instead of the left side of equation (41) to subtract a constant K:

$$\frac{T_1 - T_2}{T_1 + T_2 - 2(n-1)t_c - K} . \quad (43)$$

Likewise, instead of the equation (42), an arithmetic operation of $(C_1 - C_2)/(C_2 - C_{ST})$ should be performed to determine the pressure P, that is, the following expression should be employed:

$$\frac{T_1 - T_2}{T_2 - (n-1)t_c - K} . \quad (44)$$

Temperature compensation will now be described. The μ-COM processor 7 provides signals PO1 and PO2 to switch SW21 and SW22 to the temperature measurement mode configuration. In this configuration, the temperature measuring capacitor $C_s$ is selected as the input capacitor and the thermistor $R_s$ is connected to be in parallel with the resistor R in the convertor circuit 3. Although the resistor R is coupled in parallel with the thermistor $R_s$, the resistance of the thermistor $R_s$ is much smaller than that of the resistor R so that operation will not be influenced by the resistor R.

The charging time $t_3$ for the Capacitor Cs is given by:

$$t_3 = -R_s C_s \log_e \left(1 - \frac{VTH}{VDD}\right) . \quad (45)$$

A total counting time $T_3$ for the capacitor Cs may be expressed as follows:

$$T_3 = nt_3 + (n-1) t_c . \quad (46)$$

Temperature can be measured by storing in advance a relationship between the total counting time $T_3$ and temperature in the memory of the μ-COM processor. Measurements tend to be affected directly by variations in the voltages VDD and VTH. However, the errors are in the compensation only and are therefore negligible.

Conversion of capacitances into frequency signals is subject to errors caused by variations in the time discharge $t_c$ (see equation 22). Such errors can be rendered negligible by selecting the charging times $t_1$ and $t_2$ to be much greater than $t_c$.

As is apparent from the equations (39) and (40), factors such as the resistance R and the voltages VDD, VTH are divided out. Therefore, variations in these factors also tend to divide out.

While in the foregoing embodiment the charging time for the capacitor C is determined in making the measurement, the discharging time of the capacitor may likewise be used for making the same measurement with appropriate modifications to the apparatus as will be obvious to one skilled in the art.

With the embodiment shown in FIG. 12, the resistor R and the flip-flop Q1 are shared for the measurements of $C_1$ and $C_2$. However, separate resistors and flip-flops may be provided for measuring $C_1$ and $C_2$.

According to the present invention, the measurement apparatus comprises a digital circuit so as to be free from influences of noise and temperatures. Therefore, physical quantities are measured with increased accuracy. The apparatus consumes a relatively small amount of electric power. Since influences of temperatures and stray capacities can be compensated by means of processing operations, no special compensation circuits are necessary. Pressures, instead of differential pressures, can easily be measured simply by changing the processing operations, that is, by changing the program in the processor. Thus, the measurement apparatus is highly advantageous.

The adjustment of zero point and full scale according to the present invention will now be described with reference to FIG. 4. The keyboard 10 includes pushbuttons PB1 and PB2 for providing commands for the zero point and full scale adjustments, respectively. When the operator depresses the zero point adjustment pushbutton PB1 after confirming that no input is applied, the μ-COM processor performs a measurement under zero input conditions. The result of the measurement is then stored in a memory (not shown) in the μ-COM processor. Thereafter, the operator depresses the full scale adjustment pushbutton PB2 after confirming that a full scale input is present, and the μ-COM processor performs a measurement under full scale conditions. The results of this measurement is also stored in the memory. These stored data is used to compensate the results of subsequent processing operations. The memory in the μ-COM processor should preferably comprise a CMOS RAM (random-access memory) backed up by a battery.

With the above arrangement, the measurement apparatus includes a digital processor and memory for storing the results of processing operations when zero and full scale inputs are applied in response to the operation of the zero point adjustment and full scale adjustment pushbuttons, respectively. Since the zero point and full scale data are independently measured and stored, there is no risk of the zero point shifting during the full scale adjustment. Therefore, the adjustment operations are easily performed and accurate.

An application in which the measurement apparatus of the present invention provides measurement data for transmission over an optical transmission path to a central processor in a remote control room (not illustrated) will be described with reference to FIG. 4. An optical transceiver circuit 8 serves to carry out optical transmission of measurement data of the type described in the foregoing embodiments. The optical transceiver circuit 8 comprises a photodiode PD for receiving optical signals transmitted from a central processor or computer, and a light-emitting diode LED for transmitting optical signals to the central processor. The measurement apparatus operates only at desired times in response to commands transmitted as optical signals from the central processor. The transmitted data may be in the form of known pulse-width modulated (PWM) or pulse-code modulated (PCM) optical signals, or simply optical signals having certain frequencies or wavelengths. Where a plurality of measurement apparatus are connected to the central processor, information can be transmitted to and from the plurality of measurement apparatus in a multiplex mode. Since the measurement apparatus operates only at required times, it may be powered by a battery power supply circuit 9 of a relatively small capacity. The battery power supply circuit 9 may comprise a lithium cell, an automatically chargeable combination of a solar cell and a nickel-cadmium battery, or a nickel-cadmium battery that can be put into operation upon supply of optical power.

With the above arrangement, the measurement apparatus uses a digital circuit which is free from adverse effects caused by noise or temperature variations. The measurement apparatus has improved measurement accuracy and a relatively small power requirement. Optical transmission of information between the measurement apparatus and the central processor or computer is not adversely affected by noise or surges, resulting in more reliable transmission of measurement data. The apparatus with its optical transmission system can be safely used even in an explosion environment.

Figure 14:
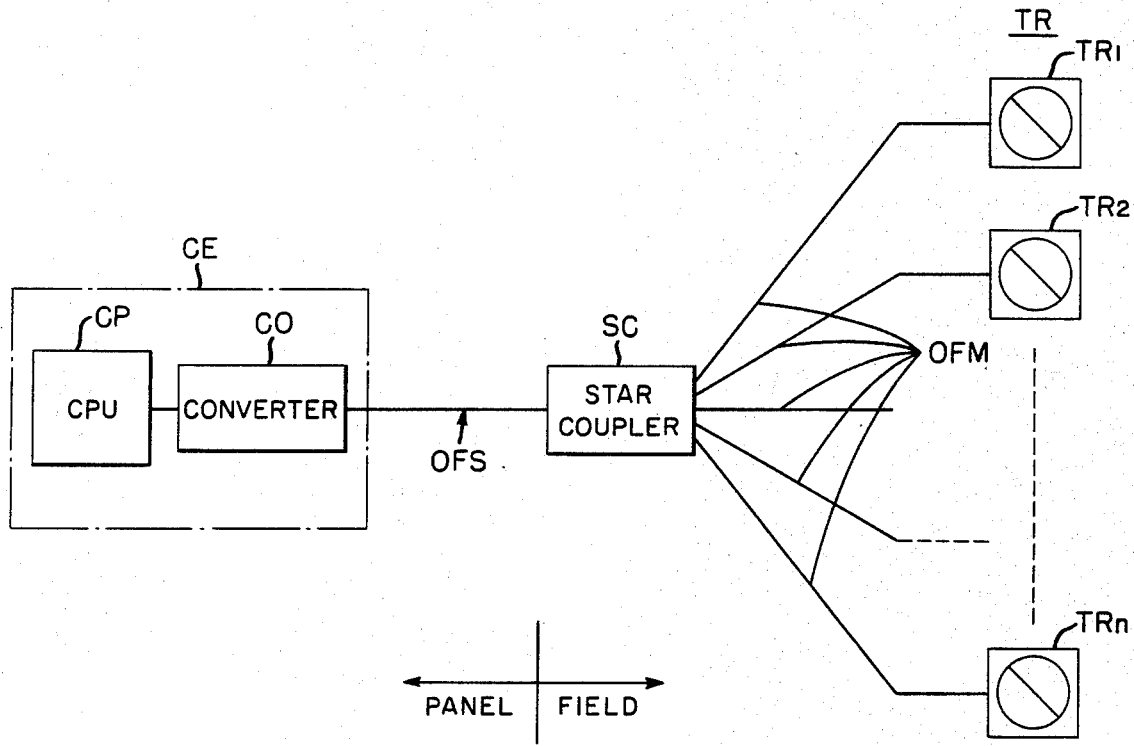
FIG. 14 is a block diagram of a system in which a plurality of measurement apparatus are connected to a central processor.
Figure 16:
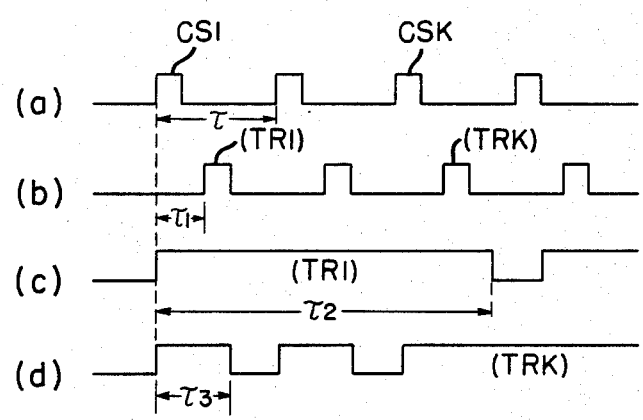
FIG. 16 is a timing chart illustrating information transmitting operations in the system of FIG. 14.
Figure 17:
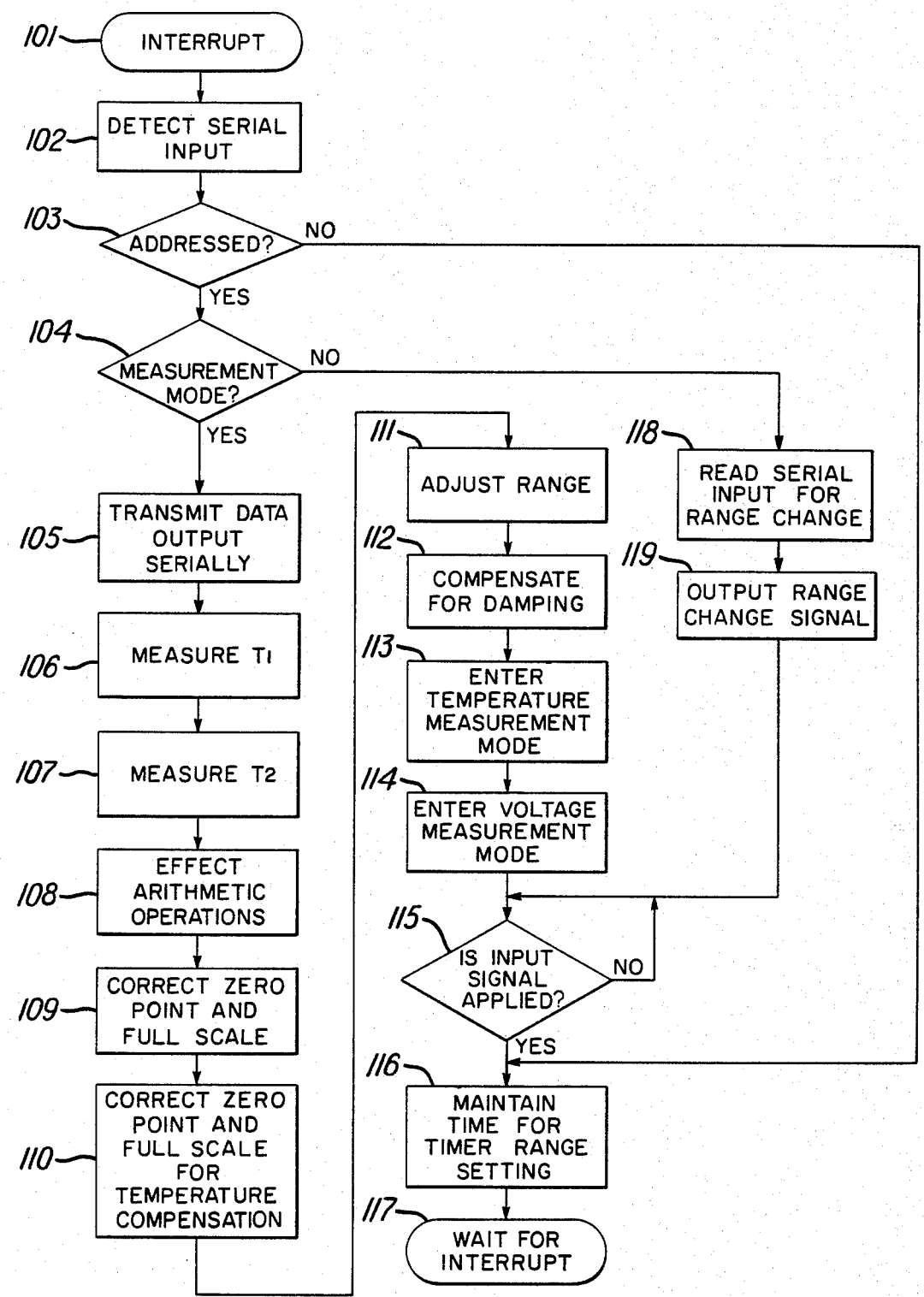
FIG. 17 is a flowchart illustrating measurement and information transmission operations in the system of FIG. 14.

A system including a central processor and a plurality of measurement apparatus connected thereto will be described with reference to FIG. 14 which is a system block diagram, FIG. 15 which shows the forms of information transmitted between the central processor and the measurement apparatus, FIG. 16 which is a timing chart and FIG. 17 which is a flowchart of measurement operations. As shown in FIG. 14, the system includes a central control room CE having therein a central processor CP and a transducer or transceiver unit CO including electric-to-optical and optical-to-electric transducers, a plurality of digital measurement apparatus $TR_1$-$TR_n$ (hereinafter referred to as "transmitters") for measuring a variety of physical quantities, a star coupler (commercial name) for mixing and dividing optical information between the central processor CP and the transmitters, and optical fibers OFS and OFM. The star coupler SC is located in the field for economic reasons to prevent the optical fibers OFM coupled to the transmitters from being too long.

Figure 15:
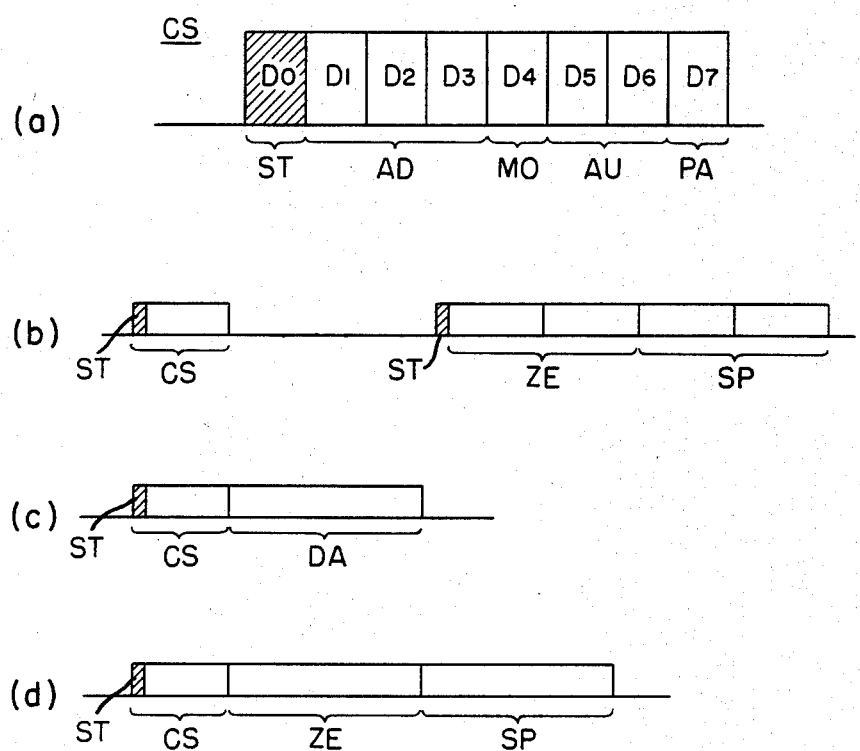
FIG. 15 illustrates the forms of information transmitted between the central processor and the measurement apparatus in the system shown in FIG. 14.

FIG. 15 shows the forms of the information transmitted between the transmitters and the central processor CP. FIG. 15(a) illustrates the format of the control information CS. FIG. 15(b) shows the format of information transmitted from the central processor CP to the transmitters for setting a measurement range (a condition hereinafter referred to as the "range setting mode"). FIG. 15(c) illustrates the format of measurement data transmitted from a transmitter to the central processor (a condition called the "measurement mode"). FIG. 15(d) shows the format of information sent back by a transmitter to the central processor confirming that the transmitter has received range setting information from the central processor.

As illustrated in FIG. 15(a), the control information CS is composed of a start bit ST ($D_0$), address information bits AD ($D_1$-$D_3$) identifying a particular transmitter, mode bit MO ($D_4$) indicating either the measurement mode or the range setting mode, auxiliary bits AU ($D_5$ and $D_6$), and a parity bit PA ($D_7$). During the measurement mode, the data as shown in FIG. 15(a), is delivered from the central processor to the transmitters, and control information CS and measurement data DA, as shown in FIG. 15(c), are transmitted from an addressed transmitter to the central processor. All of the transmitters are simultaneously put into operation in response to the start bit ST of the control information, and those transmitters which are not addressed will enter a standby mode after a predetermined interval of time. In the range setting mode the transmitters receive the control information CS, as illustrated in FIG. 15(b), and after a predetermined period of time, zero point information ZE preceded by a start bit St and full scale information SP. The transmitters upon receiving such information sends the received information, as shown in FIG. 15(d), back to the central processor to confirm that the range setting information was correctly received.

Assuming that the transmitter $TR_1$ is selected by a control signal CS1 and the transmitter TRK is selected by a control signal CSK when control information as shown in FIG. 16(a) is transmitted by the central processor. The control signals CS1 and CSK are respectively returned by transmitters TR1 and TRK after a delay $\tau$, following their transmission as illustrated by FIG. 16(b). Transmitter TR1 is active for a period $\tau_2$ following its selection by CS1, as shown by FIG. 16(c). The period $\tau_2$ is the time required for a transmitter to perform its measurement and processing operations. The transmitter TRK is active for a short period $\tau_3$ following reception of a control signal which does not select TRK. Upon receiving the control signal CSK, transmitter TRK remains active for a period $\tau_2$, as illustrated by FIG. 16(d). So long as the interval $\tau$ between adjacent blocks of control information, as shown in FIG. 16(a), is greater than $\tau_1$ and $\tau_2$, the interval $\tau$ and the order of selection of the transmitters may be freely selected or changed.

Information transmitting and receiving operations of each transmitter will be described with reference to the flowchart of FIG. 17. The $\mu$-COM processor in a particular transmitter starts to operate in response to an interrupt signal (start bit) supplied from the central processor (101) by reading the serial control information (102), as shown in FIG. 15 (a), and determining whether or not the particular transmitter is addressed by the received control information (103). If it is not addressed, the transmitter waits a predetermined time of 10 mS (116) and then enters a mode for awaiting a next interrupt (117). If the particular transmitter is addressed, the $\mu$-COM processor therein determines if the measurement mode is being selected (104). If the measurement mode is not being selected the $\mu$-COM processor reads input data for changing range (118) and sends the input data back to the central processor to confirm that the input data has been received (118). The $\mu$-COM processor then confirms that there is another input signal (115) in order to prevent erroneous operation caused by such other input signal. Thereafter, the $\mu$-COM processor waits the predetermined period of 10 mS (116) before entering into the interrupt awaiting mode (117). If the measurement mode is selected at the step (104) the result of previous processing operations is serially transmitted (105). Thereafter, $T_1$ is measured (106) and the processing operations associated with $T_1$ are performed. $T_2$ is also measured if required (107), and the required processing operations associated with $T_1$ and $T_2$ are performed (108). Adjustment of zero point and full scale are then made (109) followed by compensation of the zero point and full scale for temperature changes (110). Thereafter, the μ-COM processor adjusts the measurement range (111) based on range setting information already received from the central processor. If any damping is present, a predetermined processing operation is performed to compensate for such damping (112). Measurements of the temperature (113) and the battery voltage (114) are then made. The presence of another input signal is then confirmed (115) to prevent the transmitter from making errors caused by such other input signal. Thereafter, the transmitter waits a predetermined period of 10 mS (116) and then enters the interrupt awaiting mode (117).

With the foregoing arrangement, the measurement apparatus is capable increased measuring accuracy by virtue of using digital processing. With such measurement apparatus coupled to a central processor through optical transmission links, measurement data or other data can be reliably transmitted over the optical transmission links without being adversely affected by noise or surges. Since the transmitters are optically coupled to the central processor by a star coupler, the number and length of optical transmission links can be reduced, resulting in cost savings. The system of the present invention has the added advantage in that the failure of one transmitter does not adversely affect other transmitters.

By suitably changing the forms of information to be delivered from the central processor to the transmitters, the setting of measurement ranges, the compensation for damping and the adjustment of zero point and full scale can be performed under the control of the central processor.

Figure 18:
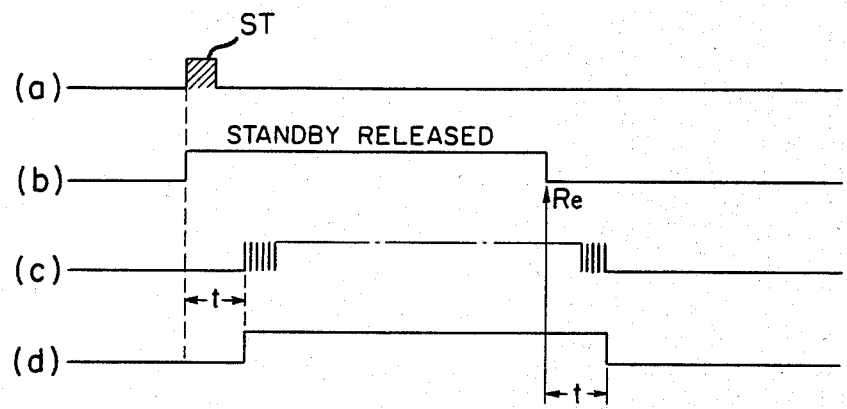
FIG. 18 is a timing chart explaining the intermittent operation of a single measurement apparatus coupled to a central processor.
Figure 19:
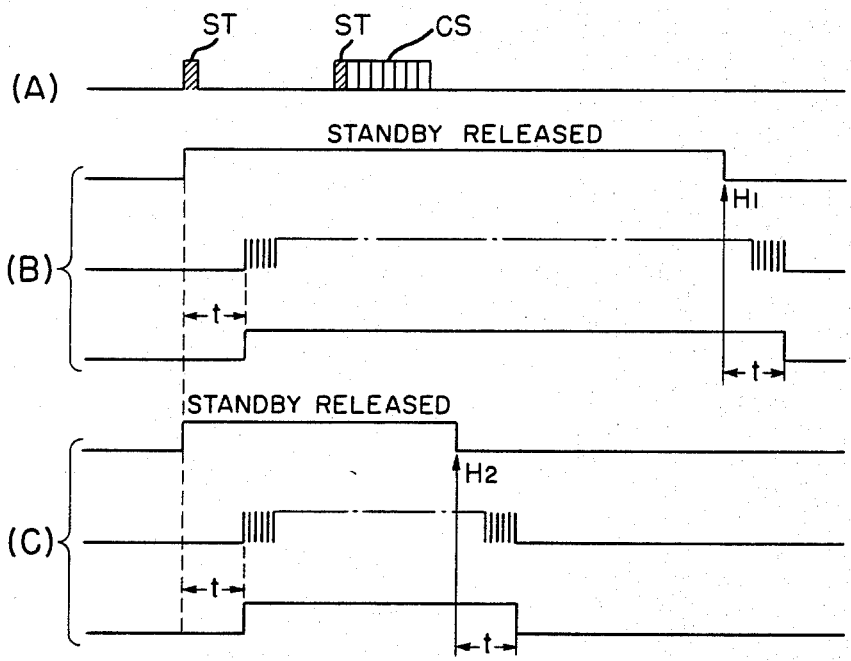
FIG. 19 is a timing chart explaining the intermittent operation of n measurement apparatus coupled to a central processor.

The manner in which the clock generator circuit and the μ-COM processor are intermittently operated in the measurement apparatus of the invention will now be described with reference to FIG. 4 and the timing diagrams of FIGS. 18 and 19. The measurement apparatus performs predetermined processing operations under commands from the central processor in the central control room. Such commands are received by the photodiode PD in the optical transceiver circuit 8. When a command, as shown by the signal ST in FIG. 18(a), is received by the photodiode PD, transistor TR is driven to conduct providing a low logic level signal to an inverter IN. The inverter IN provides a high logic level signal to input terminal SI of the μ-COM processor and the CP terminal of a flip-flop FF in the standby mode circuit 12. In this manner, the flip-flop FF is then set and the μ-COM processor is released from its standby condition, as illustrated in FIG. 18(b). The output signal from the Q terminal of FF is delayed for a certain period, as shown by t in FIG. 18(c), by operation of a delay circuit comprising a resistor $R_{SB}$ and a cacapacitor $C_{SB}$. The clock generator circuit 6 commences operation upon receiving the delayed output signals from FF as shown in FIG. 18(c). At the same time, the μ-COM processor also starts its operation, as shown in FIG. 18(d), for performing predetermined processing operations. Upon completion of the processing operations, the μ-COM processor resets the flip-flop FF via a signals from terminal PO4 (as shown by the arrow Re in FIG. 18). The μ-COM processor then enters a standby mode upon receiving a reset signal from the $\overline{Q}$ terminal of the flip-flop FF.

With the delay circuit interposed between the flip-flop FF and the clock generator circuit, the clock generator circuit and the μ-COM processor do not stop their operation immediately but are delayed for an interval t before they are inactivated. Stated otherwise, the μ-COM processor is halted after it has completed its processing operations and after an interval t, enters the standby mode. The delay circuit ensures that the clock generator circuit does not stop its operation before the μ-COM processor is in the standby mode.

The above discussion deals with the intermittent operation of a single measurement apparatus connected to the central processor. The manner in which a plurality of measurement apparatus connected to the central processor are operated intermittently in parallel with each other will be described with reference to FIG. 19. The plurality of measurement apparatus are simultaneously activated by start information, as shown by a signal ST in FIG. 19(A), received from the central processor CP. Whereupon, the μ-COM processors in the measurement apparatus are released from the standby condition, and the clock generator circuits therein are activated after a delay interval. Some of the measurement apparatus are addressed by the central processor as represented by the waveforms in FIG. 19(B), while others are not addressed, as represented by the waveforms in FIG. 19(C). The addressed measurement apparatus return to the standby condition after they have performed their predetermined processing operations, as indicated by the arrow H1 in FIG. 19(B). On the other hand, the measurement apparatus that are not addressed return to the standby condition after a short time interval t, as indicated by the arrow H2 in FIG. 19. Thus, each measurement apparatus is controlled by its own μ-COM processor to enter the standby mode when not required for any measurement or processing operation, thus avoiding unnecessary power comsumption.

Because the clock generator circuit and the digital processor are the two components in the measurement apparatus which consume a relatively large amount of power, they are activated only when required. Such an arrangement significantly reduces the power consumption of the measurement apparatus and permits battery powered operation.

Figure 20:
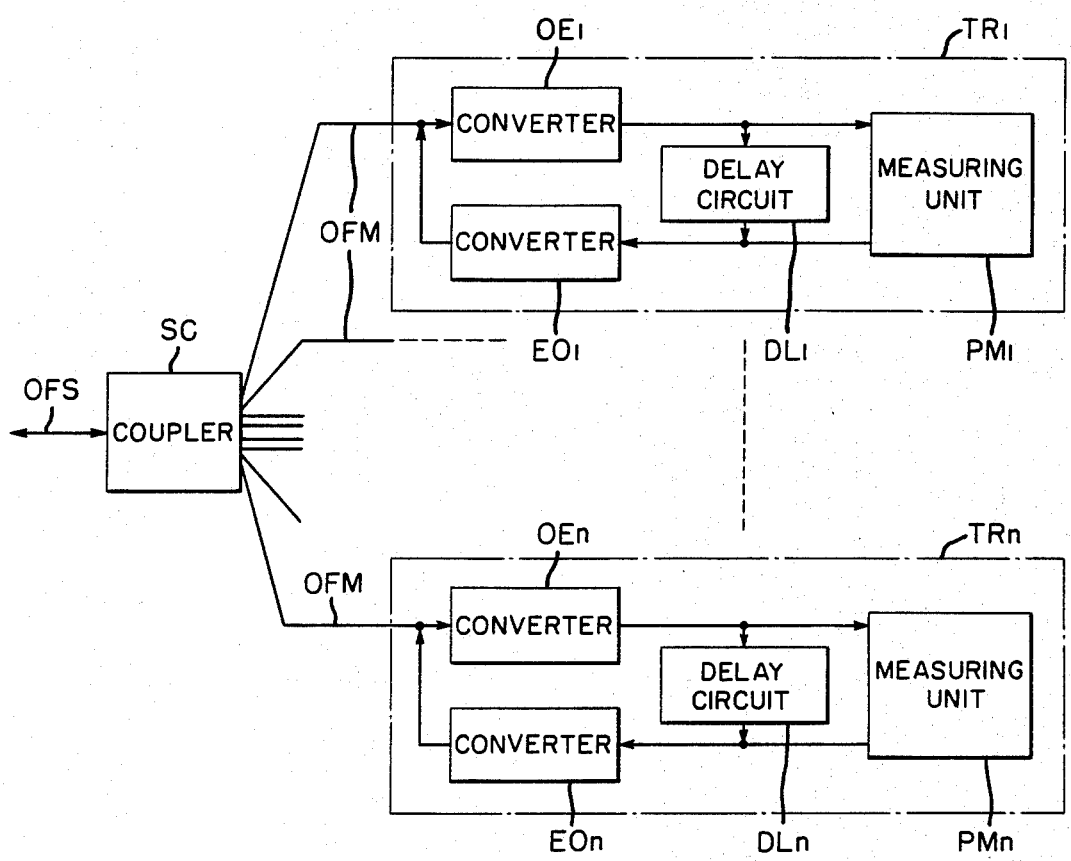
FIG. 20 is a block diagram of a system in which the failures of optical component in an optical transceiver circuit can be detected and diagnosed.
Figure 21:
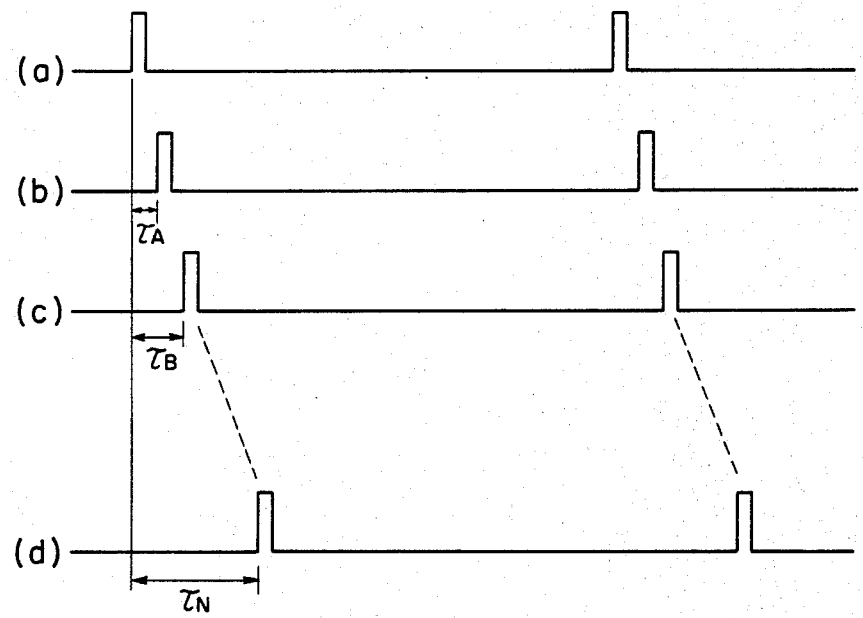
FIG. 21 is a timing chart illustrative of a failure detecting operation of the system shown in FIG. 20.

An arrangement whereby failures of the optical transceiver circuits in the plurality of measurement apparatus can be detected and a measurement apparatus having a faulty transceiver circuit identified will now be described with reference to the block diagram of FIG. 20 and the timing diagrams of FIG. 21. The system illustrated in FIG. 20 includes a star coupler SC (commercial name), optical fibers OFS and OFM and a plurality of measurement apparatus or transmitters TR1-TRn. Each measurement apparatus TRN includes an electrical-to-optical transducer EON, an optical-to-electrical transducer OEN, a delay circuit DLN (such as a shift register, a monostable multivibrator or a timer), and a measuring unit PMN for measuring physical quantities. The transducer pair OEN and EON of each measurement apparatus constitute the transceiver circuit of that apparatus.

In operation, a control signal is provided by the central processor (not shown) via the star coupler SC to all measurement apparatus. The control signal is received by the optical-to-electric transducers OE1-OEn, as represented by the pulses shown in FIG. 21(a). In each measurement apparatus TRN, the received control signal is provided directly to the measuring unit PMN and to the electrical-to-optical transducer EON through the delay circuits DLN. The delayed control signal is then transmitted back to the central processor via the star coupler. The delay circuits DL1 DLn each provide a different delay time for each measurement apparatus. Thus, the control signals which are transmitted back to the central processor arrive at different times, as shown in FIGS. 21(b) through 21(d), owing to the different delay times $\tau_A$, $\tau_B$, ... $\tau_N$ of the delay circuits DL1–DLn, respectively. The central processor can ascertain from which measurement apparatus a particular received control signal was sent by monitoring the arrival time of that control signal with respect to the other received control signals. The returning of the control signal to the central processor is independent of the $\mu$-COM processor and therefore does not burden the $\mu$-COM processor. With the above-described arrangement, the failures of the optical transceiver circuits in the plurality of measurement apparatus can be detected and a measurement apparatus having a faulty transceiver circuit identified by the central processor.

An arrangement for preventing accidental continuous operation of the light-emitting element in the optical transceiver circuit will now be described with reference to FIG. 4. The optical transceiver circuit 8 includes a transistor TRA which drives the light-emitting diode LED through another transistor TRB in the LED control circuit 11. In addition to TRB, the LED control circuit 11, includes a charging circuit comprising resistor R1 and RL and a capacitor CL and a gate G. Under normal conditions, the transistors TRA and TRB are both turned on by a high logic level pulse provided by the output terminal SO of the $\mu$-COM processor 7 causing the liqht-emitting diode LED to be turned on. If the output from the terminal SO of the $\mu$-COM processor remains at the high logic level for some reasons, a potential at point Po in the LED control circuit gradually increases owing to the charging of CL through R1. When the potential at Po reaches the switching threshold of the gate G, a high logic level voltage is provided by G to turn off transistor TRB. Thus, the light-emitting diode LED is automatically turned off by the LED control circuit after a period of time determined by the values of R1 and CL. After the output at terminal SO returns to a low logic level, transistor TRA is turned off and CL discharges through RL causing the potential at Po to return to ground potential. Because the operation of the LED control circuit is independent of the $\mu$-COM processor, operation of the $\mu$-COM processor is not burdened thereby. Prevention of continuous operation of the LED is important for avoiding serious trouble in the optical communications system and for ensuring reliable transmission of measurement data.

Figure 22:
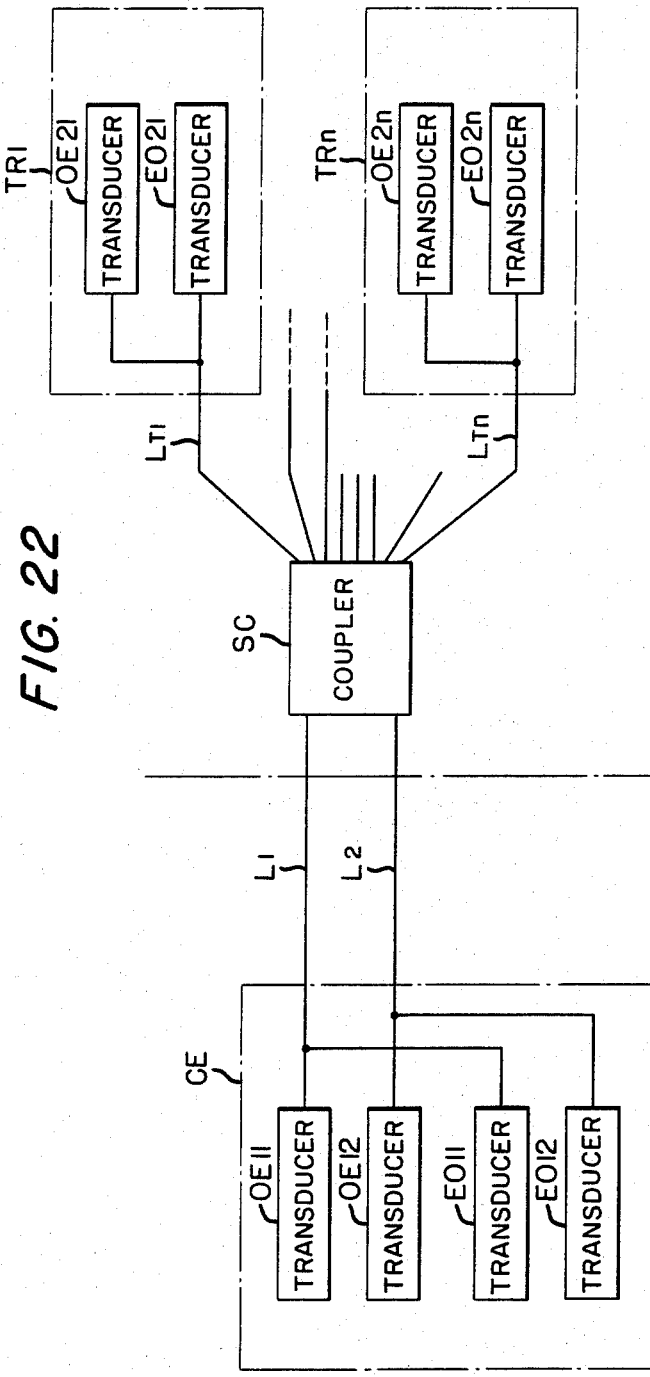
FIG. 22 is a block diagram of a system in which failures in the transceivers of the central processor and the optical transmission links connected thereto can be detected and diagnosed.

FIG. 22 is a block diagram of a system according to still another ambodiment of the present invention in which any failures in the optical transceiver circuits of the central processor, the light-emitting and light-receiving elements in the measurement apparatus, the star coupler, or the optical transmission links can be detected and diagnosed. As shown in FIG. 22, the system comprises light-receiving elements OE11, OE12, OE21–OE2n such as photodiodes, light-emitting elements EO11, EO12, EO21–EO2n such as light-emitting diodes, a central control room or panel CE, a star coupler SC by which two optical transmission links $L_1$, $L_2$ are coupled for optical transmission with n optical transmission paths $L_{T1}$–$L_{Tn}$, and n measurement apparatus or transmitters $TR_1$–$TR_n$ at remote locations.

The measurement apparatus or transmitters $TR_1$–$TR_n$ are coupled by a star coupler SC to the optical transmission links $L_1$ and $L_2$ for dividing optical data on two channels onto n channels (2:n) and for mixing optical data on n channels onto two channels (n:2). The optical transmission links $L_1$ and $L_2$ are coupled to a central processor in the central control room CE. The central processor has two optical transceiver circuits comprising two associated pairs of light-emitting and light-receiving elements EO11, OE11 and EO12, OE12 coupled to optical transmission links $L_1$ and $L_2$, respectively.

The detection and diagnosing of failures will now be described with reference to FIG. 22. Only one of the light-emitting elements EO11 and EO12 at the central processor is selected at one time to transmit command data over one of the optical transmission links $L_1$ and $L_2$ to the star coupler SC which divides the command $L_2$ into n command messages. The n command messages are transmitted respectively over the optical transmission paths $L_{T1}$–$L_{Tn}$ and are received by the light-receiving elements OE21–OE2n in the transmitters. In response to the received command message, each transmitter sends back a return message requested by the command message via its light-emitting element. The central processor locates a failure, if any, by determining whether the information based on the transmitted command data has been sent back by checking the contents of the received return messages. Suppose, for example, that the light-receiving element OE11 in the central processing unit has failed and no other failure has occurred. When command data is transmitted out of the light-emitting element EO11, responsive return messages are sent back from the transmitters $TR_1$–$TR_n$ via the star coupler SC to the optical transmission links $L_1$ and $L_2$. The return data is received by light-emitting element OE12 but not by light-receiving element OE11 which has failed. When light-emitting element EO12 is selected to transmit the command data returned data is again received only by OE12 and not by OE11.

Suppose now that light-emitting element EO11 has failed. When EO11 is selected to send command data, no returned data is received by either OE11 or OE12. With the failure in light-emitting element EO11, return data is received by light-receiving elements OE11 and OE12 only when the light-emitting element EO12 is selected to transmit the command data.

Suppose now that the optical transmission link L has failed. No data return can be received by OE11 or OE12 when command data is transmitted by EO11, but return data can be received only by OE12 when EO12 is selected to send command data. Thus, each of the above described failure locations gives rise to a unique pattern of reception and non-reception of return data by OE11 and OE12 as EO11 and EO12 are alternately selected for transmitting the command data. These patterns are shown in Table I in which the failure locations are tabulated in column (a) and the reception or non-reception of return data as represented by the symbols O and X, respectively, are tabulated in columns corresponding to OE11 and OE12 for EO11 selected and for EO12 selected.

| (a) Failure location | EO11 selected | | EO12 selected | |
|---|---|---|---|---|
| | OE11 | OE12 | OE11 | OE12 |
| OE11 | X | O | X | O |
| OE12 | O | X | O | X |
| EO11 | X | X | O | O |
| EO12 | O | O | X | X |
| L$_1$ | X | X | X | O |
| L$_2$ | O | X | X | X |
| SC | X | X | X | X |

A study of Table I indicates that the failure locations tabulated in Column (a) may be uniquely determined from the pattern of reception and non-reception of return data by OE11 and OE12 as EO11 and EO12 are alternately selected to transmit the command information. Therefore, the tabulated failures may be detected and diagnosed by the central processor by alternately selecting EO11 or EO12 to transmit command data and by analyzing the pattern of reception and nonreception of return data by OE11 and OE12. The programming of a computer to perform such detection and diagnosis will be obvious to one skilled in the art and, therefore, will not be further described. It should be noted that such failure detection and diagnosis is made possible through the use of two redundant optical transmission links L$_1$ and L$_2$ and two redundant optical transceiver circuits. The detection of failures in the optical transceiver circuits of the measurement apparatus and the optical transmission paths L$_{T1}$–L$_{Tn}$ may also be performed by the central processor by analyzing the individual return messages in the return data and their respective delays in the manner described above in connection with FIGS. 20 and 21. The programming of a computer to perform such analysis will be obvious to one skilled in the art. The incorporation of the above-described self-testing capability in the measurement and data transmission system provides the system with increased reliability.

Figure 23:
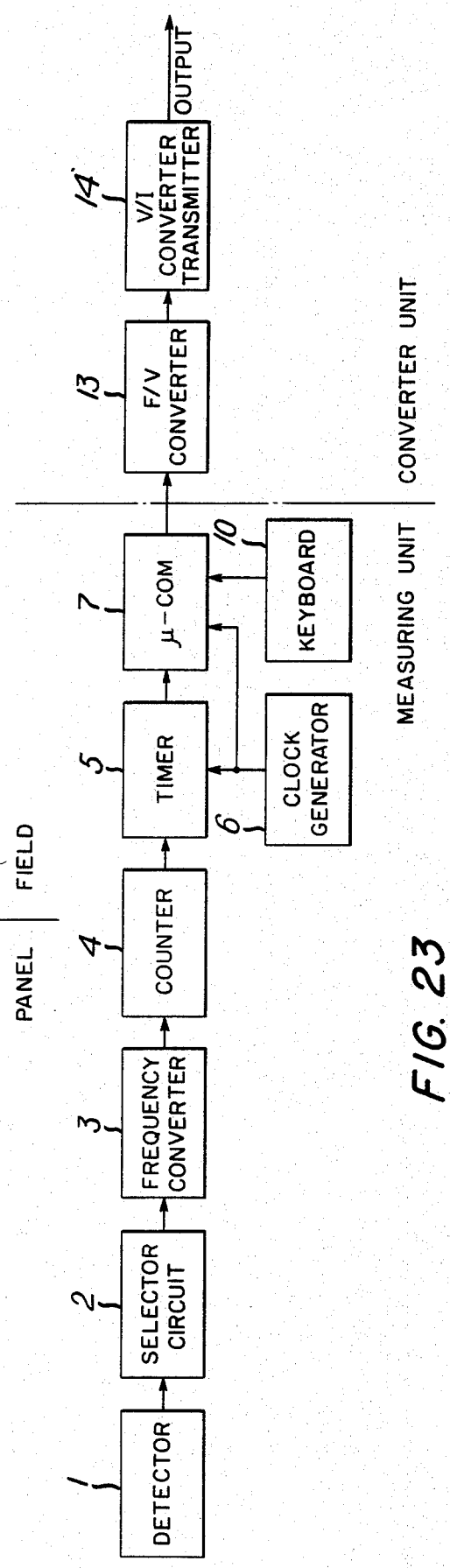
FIG. 23 is a block diagram of a measurement apparatus according to the present invention for producing a current as output data.

While in the foregoing embodiments optical digital output signals are transmitted from the measurement apparatus to a central processor, the present invention is applicable to a measurement apparatus which transmits measurement data in the form of a current signal. Such a measurement apparatus will now be described with reference to the block diagram of FIG. 23 and the circuit diagram of FIG. 24. As shown in FIG. 23, the measurement apparatus comprises a detector 1, a selector circuit 2, a frequency converter circuit 3, a counter 4, a timer 5, and reference clock generator circuit 6, a microprocessor 7 ("μ-COM processor"), a frequency-to-voltage (F/V) converter circuit 13, a voltage-to-current (V/I) converter and transmitter circuit 14, and a keyboard 10. The components designated by reference numerals 1–7 and 10 jointly constitute a measuring unit 55 and the components designated by reference numerals 13 and 14 jointly constitute a converter unit. The F/V converter circuit and the V/I converter and transmitter circuit are of a known construction.

Figure 24:
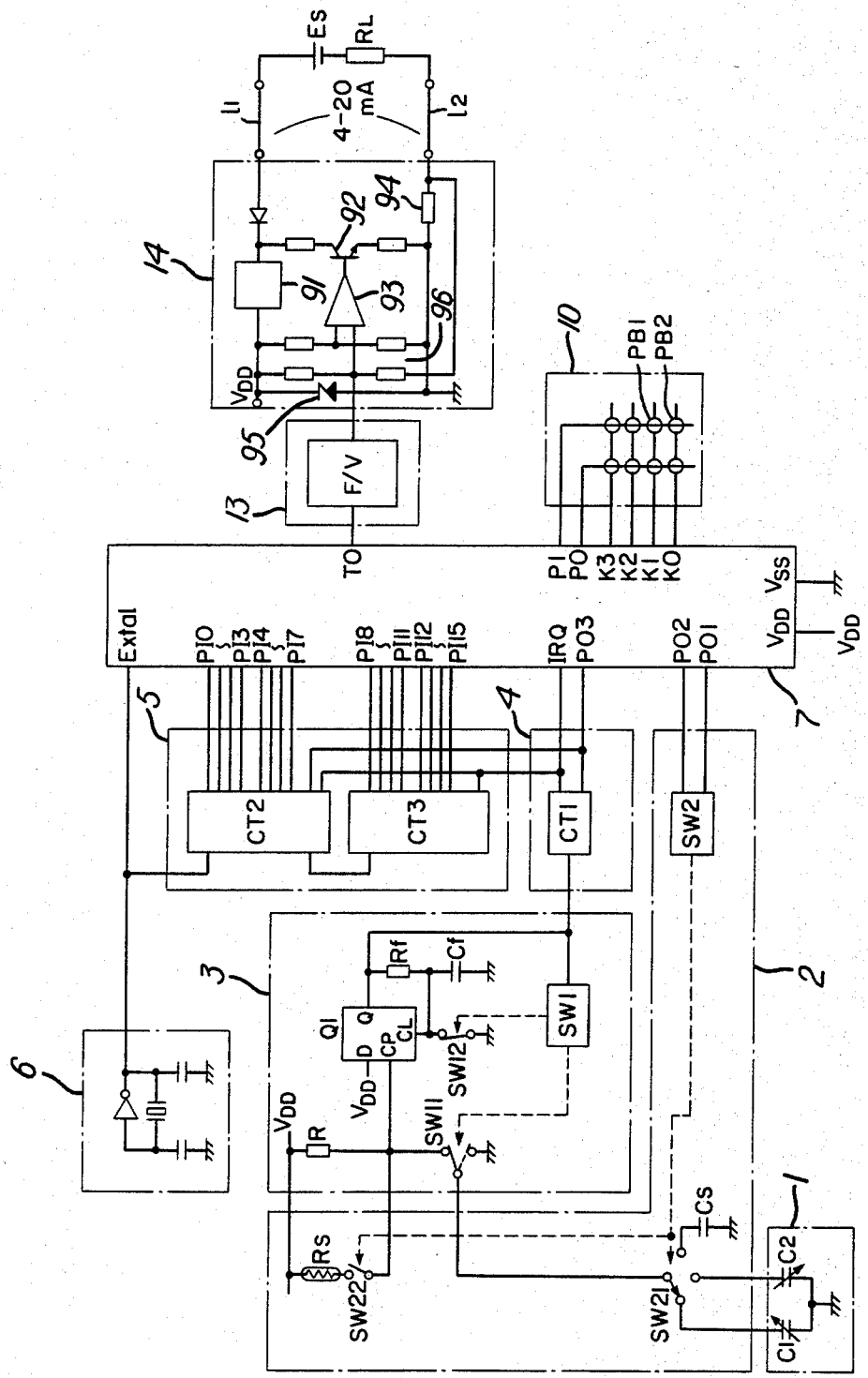
FIG. 24 is a schematic circuit diagram of some of the circuit blocks of the measurement apparatus shown in FIG. 23.

Measurement of the physical quantity is performed with the μ-COM processor providing a frequency signal to the frequency-to-voltage (F/V) converter circuit 13. The output of the F/V converter is provided to the voltage-to-current (V/I) converter and transmitter circuit 14 which is capable of producing an output current, ranging from 4 to 20 mA. The current signal is transmitted to a remotely located device (load resistor RL) on a panel. The measuring unit ME, as shown in FIG. 23 does not have its own power supply, and is powered by the V/I converter and transmitter circuit 14. The F/V converter 13 operates to convert the frequency signal from the μ-COM processor to a corresponding analog quantity. The analog quantity is again converted by the V/I converter circuit 14 into a current in the range of from 4 to 20 mA. Such a current range is compatible with other measurement equipment and devices on the panel. Therefore, the measurement apparatus as shown in FIGS. 23 and 24 first converts an analog quantity into a digital data (frequency signal), and then converts the digital data back into an analog quantity. The measurement apparatus however, performs only digital processing operations on the measurement signals and, therefore, provides improved accuracy over conventional analog measurement apparatus. Moreover, through the use of digital processing, various corrections and compensations of the measurement data can be easily provided, and the measurement apparatus is less influenced by noise and surges.

Although the measurement apparatus is shown to provide a frequency signal, it may also be designed to provide an output signal which is pulse-width modulated, or other forms of digital signals which can then be converted by an appropriate converter to a voltage signal. The measuring unit is advantageously isolated from the power supply circuit and the voltage-to-current (V/I) converter circuit.

We claim:

1. An apparatus for measuring a physical quantity and providing corresponding measurement data comprising:
  (a) transducer/converter means for converting a physical quantity being measured to a corresponding frequency signal having a frequency which is related to the physical quantity, the transducer/converter means including a transducer for converting the physical quantity being measured to a corresponding voltage signal, and a converter circuit having: a capacitor, means including a constant current source for selectively charging and discharging the capacitor, comparator means for comparing a voltage across the capacitor with the voltage signal and for providing an output signal when the voltage across the capacitor is equal to or greater than the voltage signal, and monostable flip-flop means responsive to the output signal from the comparator means for providing a sequence of pulses having a frequency related to the voltage signal;
  (b) counter means responsive to the frequency signal for providing a digital quantity related to the frequency of the frequency signal;
  (c) digital processor means for performing predetermined processing operations on the digital quantity and providing measurement data corresponding to the physical quantity being measured; and
  (d) a clock signal generator for providing a periodic sequence of clock pulses and wherein the counter means include a first counter circuit for counting the frequency cycles of the frequency signal commencing at the start of a measurement interval and for providing a counter ouput signal after a predetermined number of cycles have been counted and a second counter circuit for counting the sequence of clock pulses commencing at the start of the measurement interval and responsive to the counter output signal for stopping the counting of clock pulses and providing count data, and wherein the digital processor means is responsive to the counter output signal for reading the count data and for performing the predetermined processing operations thereon.

2. An apparatus for measuring a physical quantity and providing corresponding measurement data comprising:
   (a) transducer/converter means for converting a physical quantity being measured to a corresponding frequency signal having a frequency which is related to the physical quantity, the transducer/converter means including a measuring resistor having a resistance related to the physical quantity being measured and a converter circuit having: a capacitor, means for selectively charging the capacitor through the measuring resistor and for selectively discharging the capacitor, and monostable flip-flop means responsive to a voltage across the capacitor for providing a sequence of pulses having a frequency related to the resistance of the measuring resistor;
   (b) counter means responsive to the frequency signal for providing a digital quantity related to the frequency of the frequency signal;
   (c) digital processor means for performing predetermined processing operations on the digital quantity and providing measurement data corresponding to the physical quantity being measured; and
   (d) a clock signal generator for providing a periodic sequence of clock pulses and wherein the counter means include a first counter circuit for counting the frequency cycles of the frequency signal commencing at the start of a measurement interval and for providing a counter output signal after a predetermined number of cycles have been counted and a second counter circuit for counting the sequence of clock pulses commencing at the start of the measurement interval and responsive to the counter output signal for stopping the counting of clock pulses and providing count data, and wherein the digital processor means is responsive to the counter output signal for reading the count data and for performing the predetermined processing operations thereon.

3. An apparatus for measuring a physical quantity and providing corresponding measurement data comprising:
   (a) transducer/converter means for converting a physical quantity being measured to a corresponding frequency signal having a frequency which is related to the physical quantity, the transducer/converter means including a first and a second measuring capacitor, the capacitance of at least one of which is related to a mechanical displacement, and a capacitance-to-frequency converter circuit having: means for selectively charging and discharging one or the other of the measuring capacitors, and monostable flip-flop means alternatively responsive to respective voltages across the measuring capacitors for alternatively providing a first sequence of pulses having a frequency related to the capacitance of the first measuring capacitor and a second sequence of pulses having a frequency related to the capacitance of the second measuring capacitor;
   (b) counter means responsive to the frequency signal for providing a digital quantity related to the frequency of the frequency signal;
   (c) digital processor means for performing predetermined processing operations on the digital quantity and providing measurement data corresponding to the physical quantity being measured; and
   (d) a clock signal generator for providing a periodic sequence of clock pulses and wherein the counter means include a first counter circuit for counting the frequency cycles of the frequency signal commencing at the start of measurement interval and for providing a counter output signal after a predetermined number of cycles have been counted and a second counter circuit for counting the sequence of clock pulses commencing at the start of the measurement interval and responsive to the counter output signal for stopping the counting of clock pulses and providing count data, and wherein the digital processor means is responsive to the counter output signal for reading the count data and for performing the predetermined processing operations thereon.

4. An apparatus for measuring a physical quantity and providing corresponding measurement data comprising:
   (a) transducer/converter means for converting a physical quantity being measured to a corresponding frequency signal having a frequency which is related to the physical quantity;
   (b) counter means responsive to the frequency signal for providing a digital quantity related to the frequency of the frequency signal;
   (c) digital processor means for performing predetermined processing operations on the digital quantity and providing measurement data corresponding to the physical quantity being measured; and
   (d) a transceiver unit including an electrical-to-optical transducer for converting the measurement data into optical information for transmission to a central processor and an optical-to-electrical transducer for receiving optical information from the central processor and for converting the received optical information to electrical signals, wherein the digital processor means is responsive to a command signal from the transceiver unit corresponding to a command signal from the central processor specifying a measurement operation for performing predetermined processing operations corresponding to the specified measurement operation, and providing a completion signal upon completion of the processor operations and thereafter entering a standby state following a first delay interval, the apparatus further comprising a clock signal generator for providing a clock signal to the digital processor means, a bistable circuit responsive to the command signal for providing a set state signal at an output thereof and responsive to the completion signal for providing a reset state signal at the output, and a delay circuit for delaying the reset state signal at the output of the bistable circuit by a second delay interval equal to or greater than the first delay interval and providing the delayed reset state signal to the clock signal generator, the clock signal generator being deactivated in response to the delayed reset state signal whereby the digital processor means is permitted to enter the standby state before the clock signal generator circuit is deactivated.

5. An apparatus for measuring a physical quantity and providing corresponding measurement data comprising:
(a) transducer/converter means for converting a physical quantity being measured to a corresponding frequency signal having a frequency which is related to the physical quantity;
(b) counter means responsive to the frequency signal for providing a digital quantity related to the frequency of the frequency signal;
(c) digital processor means for performing predetermined processing operations on the digital quantity and providing measurement data corresponding to the physical quantity being measured; and
(d) a transceiver unit including an electrical-to-optical transducer for converting the measurement data into optical information for transmission to a central processor and an optical-to-electrical transducer for receiving optical information from the central processor and for converting the received optical information to electrical signals, wherein the transceiver unit includes delay means between the optical-to-electrical transducer and the electrical-to-optical transducer for delaying information received by the optical-to-electrical transducer by a delay interval particular to the apparatus and providing the delayed information directly to the electrical-to-optical transducer for retransmission back to the central processor whereby a failure in the transceiver unit of the apparatus or of the transmission path connected thereto is diagnosable by the central processor from the absence of retransmitted information from the apparatus following the particular delay interval.

6. An apparatus for measuring a physical quantity and providing corresponding measurement data comprising:
(a) transducer/converter means for converting a physical quantity being measured to a corresponding frequency signal having a frequency which is related to the physical quantity;
(b) counter means responsive to the frequency signal for providing a digital quantity related to the frequency of the frequency signal;
(c) digital processor means for performing predetermined processing operations on the digital quantity and providing measurement data corresponding to the physical quantity being measured; and
(d) a transceiver unit including an electrical-to-optical transducer for converting the measurement data into optical information for transmission to a central processor and an optical-to-electrical transducer for receiving optical information from the central processor and for converting the received optical information to electrical signals, wherein the electrical-to-optical transducer means include a light-emitting element, driver means responsive to data from the digital processor means for providing intermittent current to the light-emitting element, and current control means for sensing and integrating the current flow to the light-emitting element and for interrupting the current from the driver means in response to the integrated current flow exceeding a predetermined level thereby preventing the light-emitting element from being activated for longer than a specified interval.

7. An apparatus for measuring a physical quantity and providing corresponding measurement data comprising:
(a) transducer/converter means for converting a physical quantity being measured to a corresponding frequency signal having a frequency which is related to the physical quantity;
(b) counter means responsive to the frequency signal for providing a digital quantity related to the frequency of the frequency signal;
(c) digital processor means for performing predetermined processing operations on the digital quantity and providing measurement data corresponding to the physical quantity being measured; and
(d) a transceiver unit including an electrical-to-optical transducer for converting the measurement data into optical information for transmission to a central processor and an optical-to-electrical transducer for receiving optical information from the central processor and for converting the received optical information to electrical signals, wherein the apparatus is optically coupled to the central processor through divider/coupler means for optically coupling the central processor to a plurality of measurement apparatus, the central processor including two transceiver units each coupled to the divider/coupler means through a respective optical transmission link, the transceiver units of the central processor being alternately selected to transmit command information to each of the plurality of measurement apparatus, each measurement apparatus being adapted to transmit return information to the central processor in response to receiving the command information, the central processor being adapted to detect and diagnose failures in its transceiver units, the optical transmission links coupled thereto and the divider/coupler means by analyzing the patterns of reception and non-reception of return data by the transceiver units when first one and then the other transceiver unit is selected to transmit command information.

* * * * *